(12) United States Patent
Wu

(10) Patent No.: US 11,114,251 B2
(45) Date of Patent: Sep. 7, 2021

(54) POLYMER, METHOD FOR PREPARING THE SAME AND SOLAR CELL COMPRISING THE POLYMER

(71) Applicant: BOE TECHNOLOGY GROUP CO., LTD., Beijing (CN)

(72) Inventor: Zhihong Wu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 340 days.

(21) Appl. No.: 15/959,572

(22) Filed: Apr. 23, 2018

(65) Prior Publication Data

US 2019/0066931 A1 Feb. 28, 2019

(30) Foreign Application Priority Data

Aug. 31, 2017 (CN) .......................... 201710772924.7

(51) Int. Cl.
*H01G 9/20* (2006.01)
*H01L 51/00* (2006.01)
(Continued)

(52) U.S. Cl.
CPC ........... *H01G 9/2018* (2013.01); *C08G 61/02* (2013.01); *C08G 61/126* (2013.01);
(Continued)

(58) Field of Classification Search
CPC ..... C08G 61/02; C08G 61/126; Y02E 10/549; Y02E 10/542
See application file for complete search history.

(56) References Cited

U.S. PATENT DOCUMENTS

2010/0326527 A1* 12/2010 Facchetti .............. C09B 69/102
136/263
2011/0024727 A1* 2/2011 Katz ................... H01L 51/0533
257/40

FOREIGN PATENT DOCUMENTS

| CN | 101735116 B | | 8/2013 |
| CN | 104725613 A | * | 6/2015 |
| CN | 104725613 A | | 6/2015 |

OTHER PUBLICATIONS

English machine translation of Cao et al. (CN 104725613 A) provided by the EPO website, All Pages, 2020. (Year: 2020).*

(Continued)

*Primary Examiner* — Daniel P Malley, Jr.
(74) *Attorney, Agent, or Firm* — Nath, Goldberg & Meyer; Joshua B. Goldberg

(57) ABSTRACT

The present invention provides a polymer, a method for preparing the same, and a solar cell comprising the polymer having a structure represented by Formula I, (Continued)

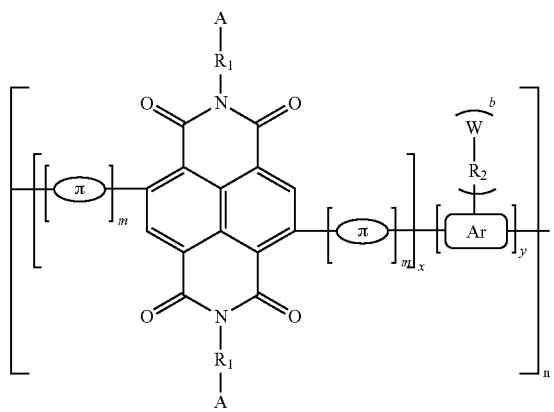

Formula I the polymer has excellent interface-modified property, water resistance and/or excellent electron-transporting property, and thus can be effectively used to prepare solar cells. The polymer not only can significantly improve the hydrophobic property of the thin film surface of the solar cell, thereby protecting the intermediate active layer of the cell from moisture in the air so as to improve the lifetime of the cell device, but also can be used for large-area processing to prepare a flexible cell device.

4 Claims, 2 Drawing Sheets

(51) Int. Cl.
    *H01L 51/44*     (2006.01)
    *H01L 51/42*     (2006.01)
    *C08G 61/12*     (2006.01)
    *C08G 61/02*     (2006.01)

(52) U.S. Cl.
    CPC ...... *H01L 51/0035* (2013.01); *H01L 51/0036* (2013.01); *H01L 51/0039* (2013.01); *H01L 51/0043* (2013.01); *H01L 51/424* (2013.01); *H01L 51/4253* (2013.01); *H01L 51/441* (2013.01); *C08G 2261/124* (2013.01); *C08G 2261/143* (2013.01); *C08G 2261/146* (2013.01); *C08G 2261/148* (2013.01); *C08G 2261/1412* (2013.01); *C08G 2261/18* (2013.01); *C08G 2261/228* (2013.01); *C08G 2261/3142* (2013.01); *C08G 2261/3223* (2013.01); *C08G 2261/3241* (2013.01); *C08G 2261/3243* (2013.01); *C08G 2261/334* (2013.01); *C08G 2261/3323* (2013.01); *C08G 2261/3328* (2013.01); *C08G 2261/344* (2013.01); *C08G 2261/364* (2013.01); *C08G 2261/411* (2013.01); *C08G 2261/514* (2013.01); *C08G 2261/91* (2013.01); *H01L 51/0037* (2013.01); *H01L 51/0053* (2013.01); *H01L 51/0077* (2013.01); *H01L 2251/308* (2013.01); *Y02E 10/549* (2013.01)

(56) References Cited

OTHER PUBLICATIONS

STN structure search for U.S. Appl. No. 15/959,572 conducted by the Examiner, All Pages, 2020. (Year: 2020).*
STN Structure search for U.S. Appl. No. 15/959,572 conducted by the Examiner, 2021, All Pages. (Year: 2021).*
English machine translation of Cao et al. (CN 104725613 A) provided by the EPO. All Pages. 2021. (Year: 2021).*
STN structure search conducted by the Examiner for U.S. Appl. No. 15/959,572, All Pages, 2021. (Year: 2021).*
Sun, et al., "Amino-Functionalized Conjugated Polymer as an Efficient Electron Transport Layer for High-Performance Planar-Heterojunction Perovskite Solar Cells", Advanced Energy Materials, vol. 6, 1501534, 2016.

* cited by examiner

POLYMER, METHOD FOR PREPARING THE SAME AND SOLAR CELL COMPRISING THE POLYMER

CROSS-REFERENCE TO RELATED APPLICATION

This application claims the priority of Chinese Patent Application No. 201710772924.7 submitted to the Chinese Intellectual Property Office on Aug. 31, 2017, the disclosure of which is incorporated herein in its entirety by reference.

TECHNICAL FIELD

The present invention relates to the field of novel materials and energy source. Particularly, the present invention relates to a polymer, a method for preparing the same and a solar cell comprising the polymer.

BACKGROUND

Perovskite solar cells use solution-processed organic-inorganic hybrid perovskite materials as the light-absorbing active layer, in which such materials have the characteristics such as strong absorption, high carrier mobility, and long carrier lifetime, and thus become the most promising materials for commercial applications. However, perovskite materials are extremely sensitive to moisture in the air, which seriously affects the stability of the device in the air, thereby limiting its large-scale application. Therefore, in order to truly commercialize such solar cell technology, it is also necessary to solve the problem of device stability and find a method for preparing a highly efficient, large-area device that can be repeatedly implemented.

Therefore, the existing perovskite solar cells are still needed to be improved.

SUMMARY

The present invention aims to solve at least to some extent one of the technical problems in the related art. To this end, the present invention provides a polymer that has excellent interface-modified property, water resistance, and/or excellent electron-transporting property, and can be effectively used for preparing solar cells. The polymer can significantly increase the hydrophobic property of the thin film surface of the solar cell, thereby protecting the intermediate active layer of the cell from moisture in the air so as to improve the lifetime of the cell device, or can be used for large-area processing to prepare a flexible cell device.

In one aspect of the invention, a polymer is provided. According to an embodiment of the present invention, the polymer has a structure shown in Formula I,

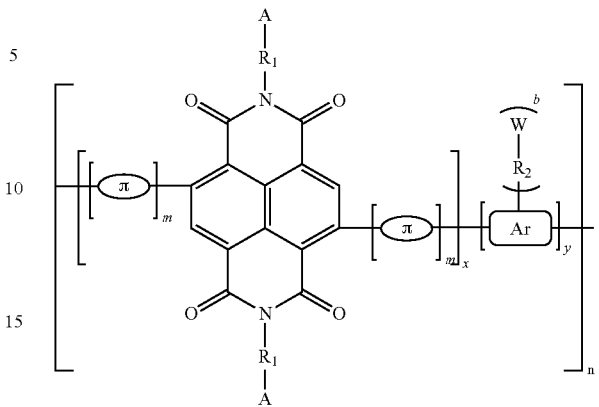

Formula I wherein, A and W are each independently a fluorinated group or an interface-modified functional group; preferably, at least one of A and W is a fluorinated group; $R_1$ and $R_2$ are each independently a substituted or unsubstituted alkylene group, and the substituted alkylene group means that at least one hydrogen in the alkylene group is substituted with at least one selected from the group consisting of a halogen atom, a hydroxyl group (—OH), an amino group (—NH$_2$), an alkenyl group, an alkynyl group, an aryl group, an ester group (—COOR$_4$, $R_4$ is a hydrocarbon group), a thiol group (—SH), a cyano group (—CN) and a nitro group (—NO$_2$), and/or at least one methylene group is substituted with at least one selected from the group consisting of an oxygen atom (—O—), an imino group (—NH—), a sulfone group (—(S=O)$_2$—), a carbonyl group (—C(=O)—), an alkenylene group, an alkynylene group, an arylene group, —C(=O)O—, sulfur atom (—S—) and nitroso group (—NO—); Ar is an aromatic group; t is a conjugated group; m is an integer of 0 to 3; q is an integer of 0 to 2; 0<x<1, 0<y<1, and x+y=1; n is an integer of 1 to 10000. It should be noted that the interface-modified functional group mentioned herein refers to a functional group that can improve the interface property between the electrode (e.g., anode or cathode) and the active layer, and has the role of adjusting the metal work function and n-type doped active layer acceptor material; x and y refer to the copolymer unit ratio. The present inventors have found that the polymer according to the present invention has excellent interface-modified property, water resistance and/or excellent electron-transporting property, and thus can be effectively used to prepare solar cells; the polymer not only can significantly improve the hydrophobic property of the thin film surface of the solar cell, thereby protecting the intermediate active layer of the cell from moisture in the air so as to improve the lifetime of the cell device, but also can be used for large-area processing to prepare a flexible cell device.

According to an embodiment of the present invention, the fluorinated group is at least one selected from the group consisting of a perfluoro substituted hydrocarbon group, a fluorine substituted aromatic ring, a fluorine substituted cyclic ether, a fluorine substituted alicyclic ring, and a fluorine substituted bridged ring; the interface-modified functional group is at least one selected from the group consisting of —N(CH$_3$)$_2$, —N(CH$_2$CH$_3$)$_2$, hydroxyl, and methoxy.

According to an embodiment of the present invention, $R_1$ and $R_2$ are each independently a substituted or unsubstituted $C_{1-20}$ alkylene group, and the substituted $C_{1-20}$ alkylene group means that at least one hydrogen in the $C_{1-20}$ alkylene group is substituted with at least one selected from a halogen atom, a hydroxyl group, an amino group, an alkenyl group, an alkynyl group, an aryl group, an ester group, a thiol group, a cyano group and a nitro group, and/or at least one methylene is substituted with at least one selected from an oxygen atom, an imino group, a sulfone group, a carbonyl group, an alkenylene group, an alkynylene group, an arylene group, —C(=O)O—, a sulfur atom and a nitroso group (—NO—).

According to an embodiment of the present invention, $R_1$ is a methylene group or a propylene group, A is a perfluorophenyl group or —N(CH$_3$)$_2$, or $R_1$ and A together constitute a perfluorooctyl group.

According to an embodiment of the present invention, $R_2$ is hexylene, dodecylene, or —(CH$_2$CH$_2$)$_r$—, W is —N(CH$_2$CH$_3$)$_2$, or —N(CH$_3$)$_2$, or $R_2$ and W together constitute a perfluorooctyl group, wherein r is an integer of 1 to 20.

According to an embodiment of the present invention, Ar is at least one selected from the group consisting of the following structural Formulas:

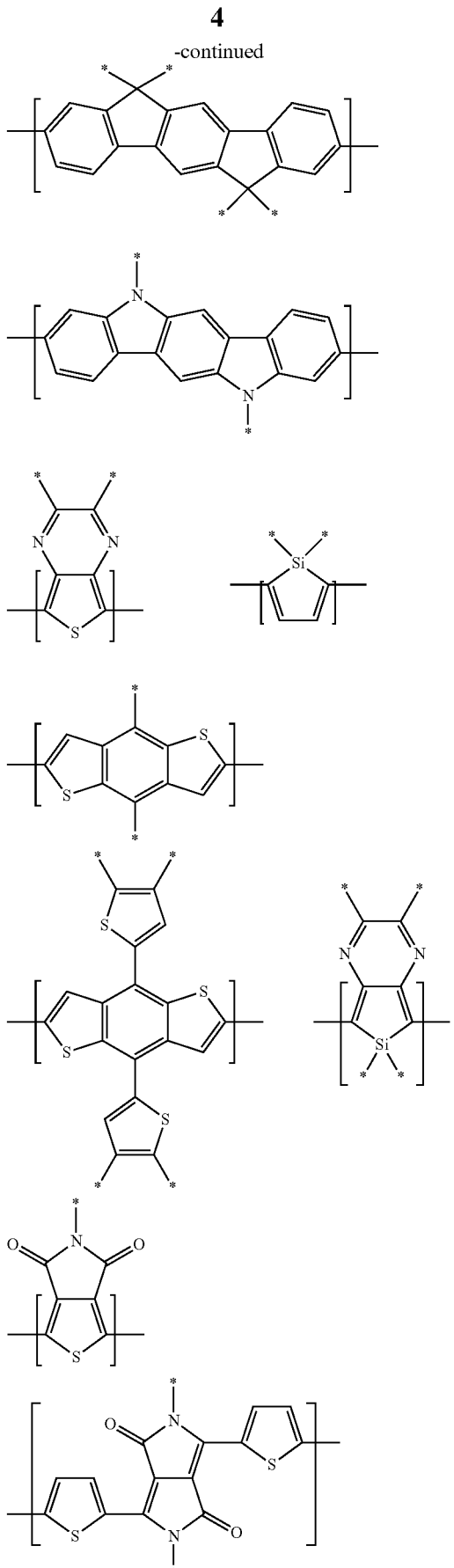

-continued
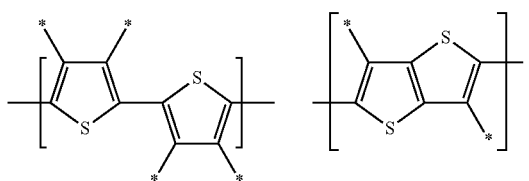 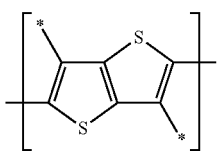
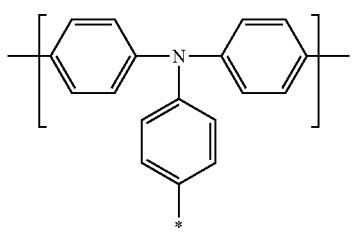
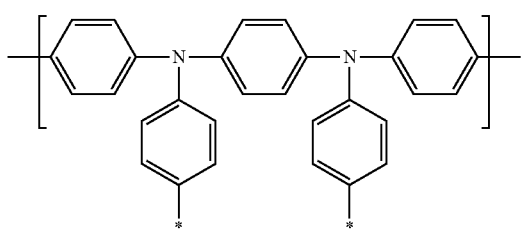
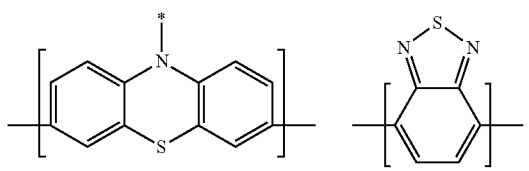
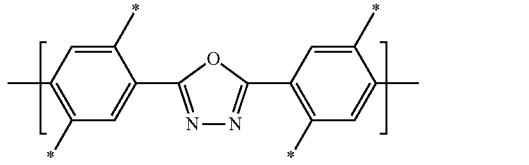
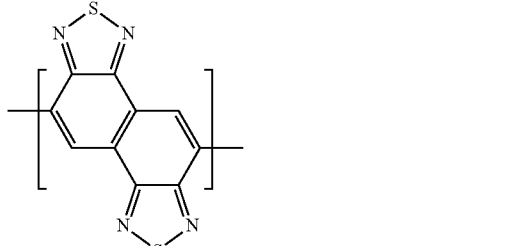
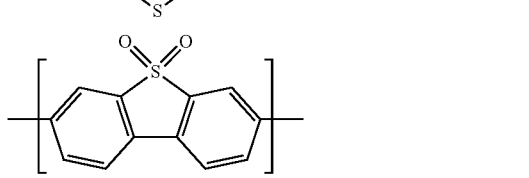
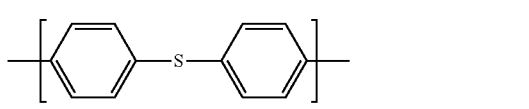
-continued
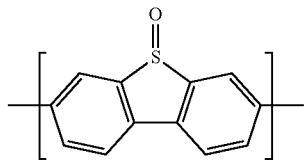
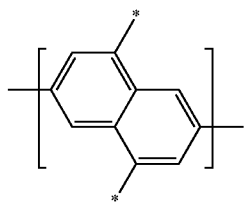
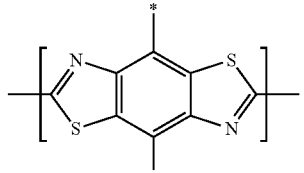
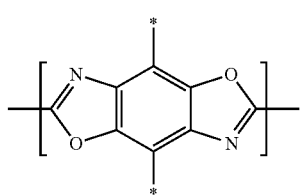
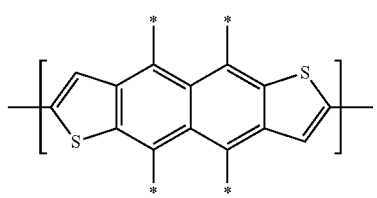
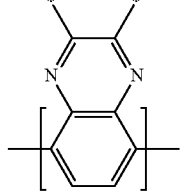
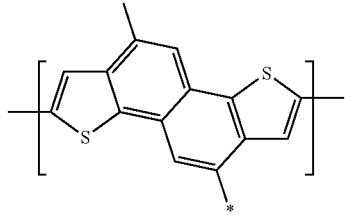
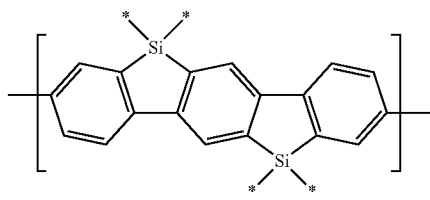

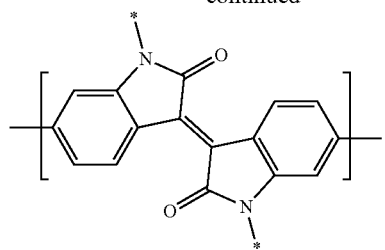

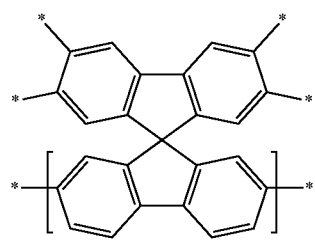

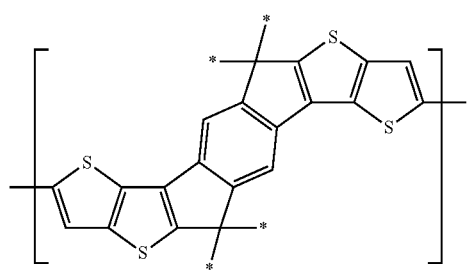

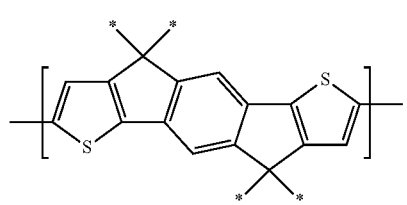

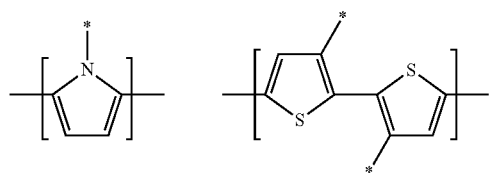

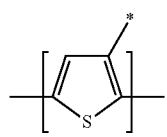

wherein, * represents a side chain attachment site.

According to an embodiment of the present invention, Ar is

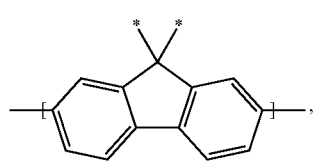

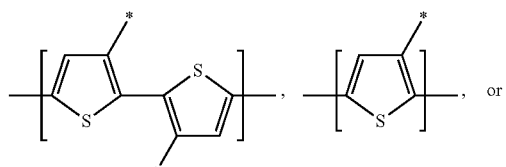

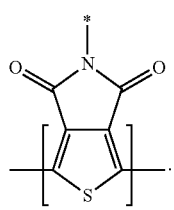

According to an embodiment of the present invention, π is at least one selected from the group consisting of a benzene ring bridge, a naphthalene ring bridge, a pyridine bridge, a pyrazine bridge, an alkenylene group, an alkynylene group, a thiophene bridge, a thiophthene bridge, a selenophene bridge, a tellurophene bridge, a furan bridge, a pyrrole bridge, a silole bridge, a thiazole bridge, an oxazole bridge and a triazole bridge.

According to an embodiment of the present invention, π is at least one selected from the group consisting of the following structural Formulas:

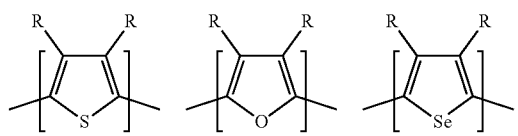

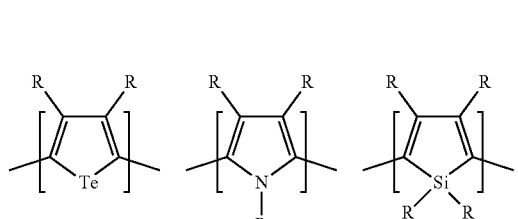

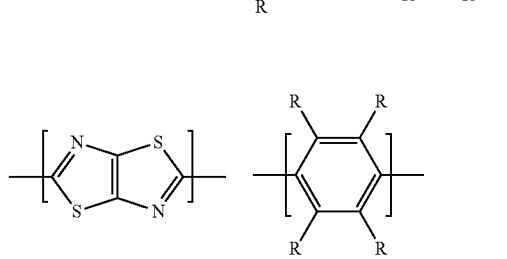

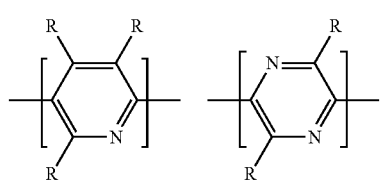

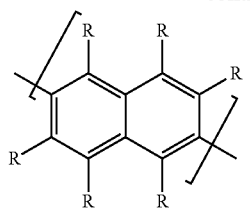

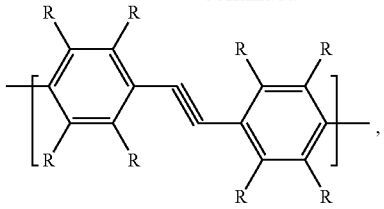

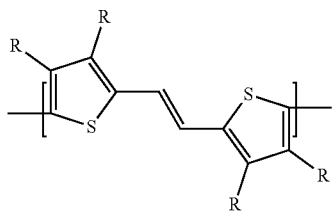

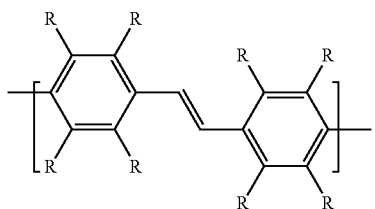

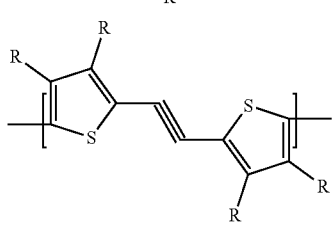

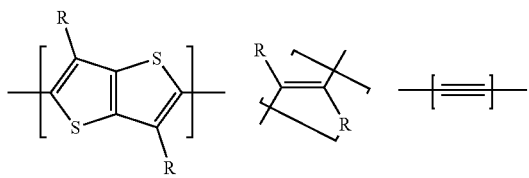

wherein each R is independently a hydrogen or a substituted or unsubstituted $C_{1-20}$ alkyl group, in the substituted $C_{1-20}$ alkyl group, at least one hydrogen is substituted with at least one selected from the group consisting of a halogen atom, a hydroxyl group, an amino group, an alkenyl group, an alkynyl group, an aryl group, an ester group, a thiol group, a cyano group and a nitro group, and/or at least one methylene group is substituted with at least one selected from the group consisting of an oxygen atom, an imino group, a sulfone group, a carbonyl group, an alkenylene group, an alkynylene group, an arylene group, —C(=O)O—, a sulfur atom and a nitroso group. Preferably, at least one hydrogen atom is substituted with at least one selected from the group consisting of a halogen atom, an alkenyl group, an alkynyl group, an aryl group, a hydroxyl group, an amino group, a carboxyl group, an ester group, a cyano group, and a nitro group.

According to an embodiment of the present invention, π is

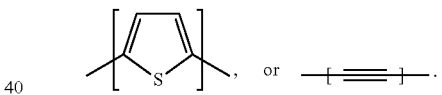

According to an embodiment of the present invention, the above polymer has one of the following structures:

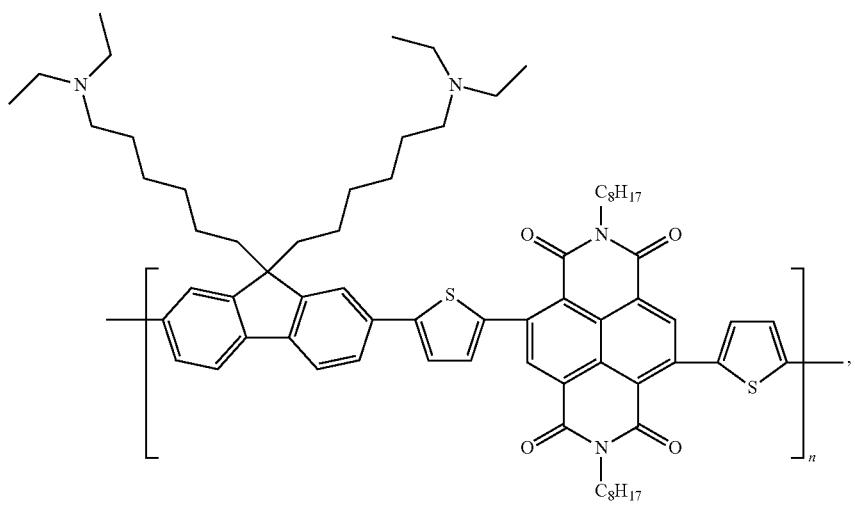

-continued
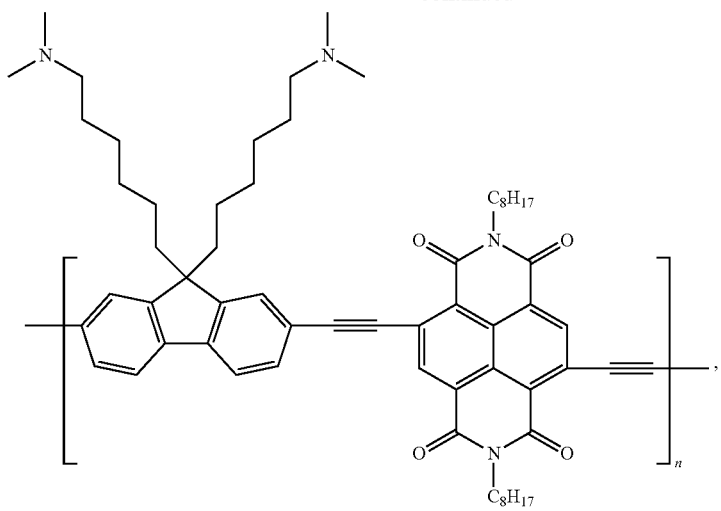
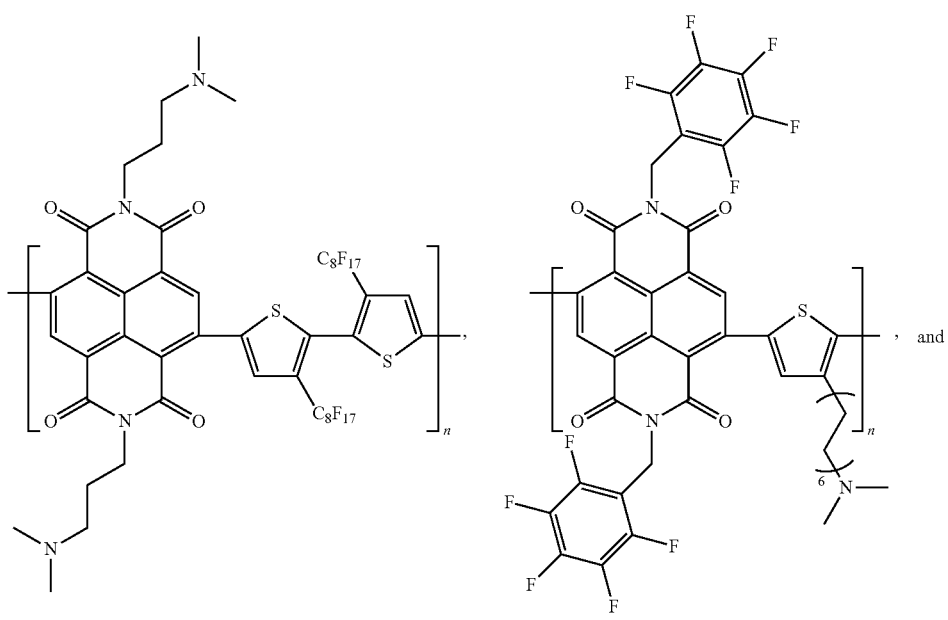

-continued

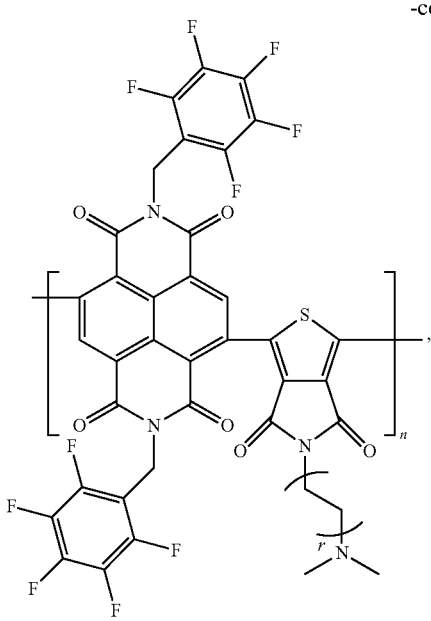

wherein n is an integer of 1 to 10000.

In another aspect of the present invention, a method of preparing the polymer is provided. According to an embodiment of the present invention, the method includes: performing an amination reaction of a compound of Formula 1 to obtain a compound of Formula 2; performing a halogenation reaction of a compound of Formula 3 to obtain a compound of Formula 4; performing an amidation reaction of the compound of Formula 2 and the compound of Formula 4 to obtain a compound of Formula 5; performing a coupling reaction of the compound of Formula 5 and a compound of Formula 6 to obtain a compound of Formula 7; performing a polymerization reaction of the compound of Formula 7 and a compound of Formula 8 to obtain a polymer of Formula I,

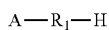 Formula 1

A—R$_1$—H

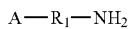 Formula 2

A—R$_1$—NH$_2$

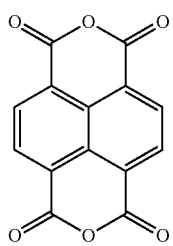 Formula 3

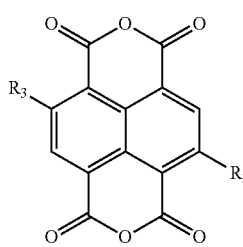 Formula 4

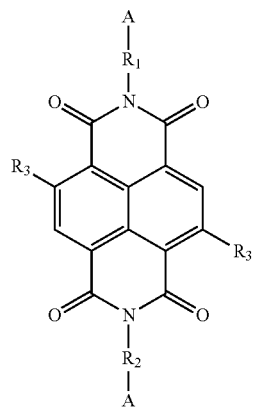 Formula 5

Π—Sn(Bu)$_3$  Formula 6

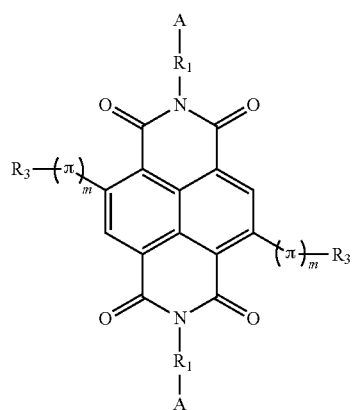 Formula 7

Formula 8

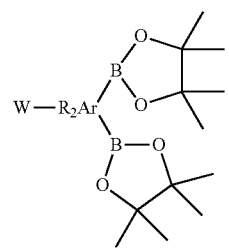

Formula I

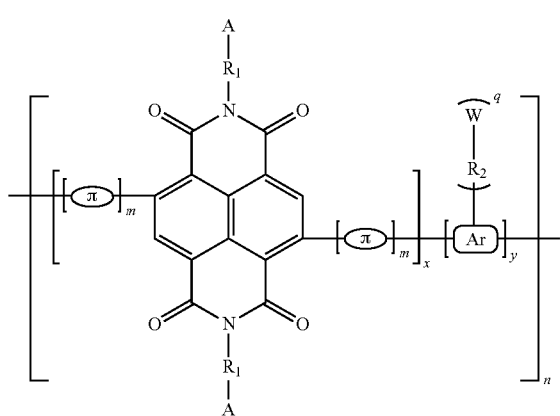

wherein, A and W are each independently a fluorinated group or an interface-modified functional group; preferably, at least one of A and W is a fluorinated group; $R_1$ and $R_2$ are each independently a substituted or unsubstituted alkylene group, in the case of the substituted alkylene group, at least one hydrogen in the alkylene group is substituted with at least one selected from the group consisting of a halogen atom, a hydroxyl group, an amino group, an alkenyl group, an alkynyl group, an aryl group, an ester group, a thiol group, a cyano group and a nitro group, and/or at least one methylene group is substituted with at least one selected from the group consisting of an oxygen atom, an imino group, a sulfone group, a carbonyl group, an alkenylene group, an alkynylene group, an arylene group, —C(=O) O—, a sulfur atom and a nitroso group; $R_3$ is a halogen; Ar is an aromatic group: π is a conjugated group; m is an integer of 0 to 3, and when each m is 0, the compound of Formula 5 is directly polymerized with the compound of Formula 8 to obtain the polymer of Formula I; q is an integer of 0 to 2; $0<x<1$, $0<y<1$, and $x+y=1$; n is an integer of 1 to 10000. The present inventors have found that the above-mentioned polymer can be prepared quickly and efficiently by this method, in which the steps are simple, the operation is easy, the industrial production is easy, and the obtained polymer has excellent interface-modified property, water resistance and/or excellent electron-transporting properties, and thus can be effectively used to prepare solar cells. As a result, the polymer of the present invention not only can significantly improve the hydrophobic property of the thin film surface of the solar cell, thereby protecting the intermediate active layer of the cell from moisture in the air so as to improve the lifetime of the cell device, but also can be used for large-area processing to prepare a flexible cell device.

In yet another aspect of the present invention, a solar cell is provided. According to an embodiment of the present invention, the solar cell contains the polymer described above. The inventors have found that the solar cell has a better hydrophobic property, the intermediate active layer can be protected from moisture in the air, the stability is greatly improved, and its photoelectric conversion performance is better. In addition, the solar cell has all the features and advantages of the polymer described above and will not be described in more detail here.

According to an embodiment of the present invention, the solar cell comprises: a cathode; an electron-transporting layer disposed on one side of the cathode and containing the polymer described above; a light-absorbing active layer disposed on the side of the electron-transporting layer away from the cathode; a hole-transporting layer disposed on the side of the light-absorbing active layer away from the electron-transporting layer; and an anode disposed on the side of the hole-transporting layer away from the light-absorbing active layer.

According to a preferred embodiment of the present invention, the light-absorbing active layer may contain perovskite.

REFERENCE SIGNS LIST

Figure 1:
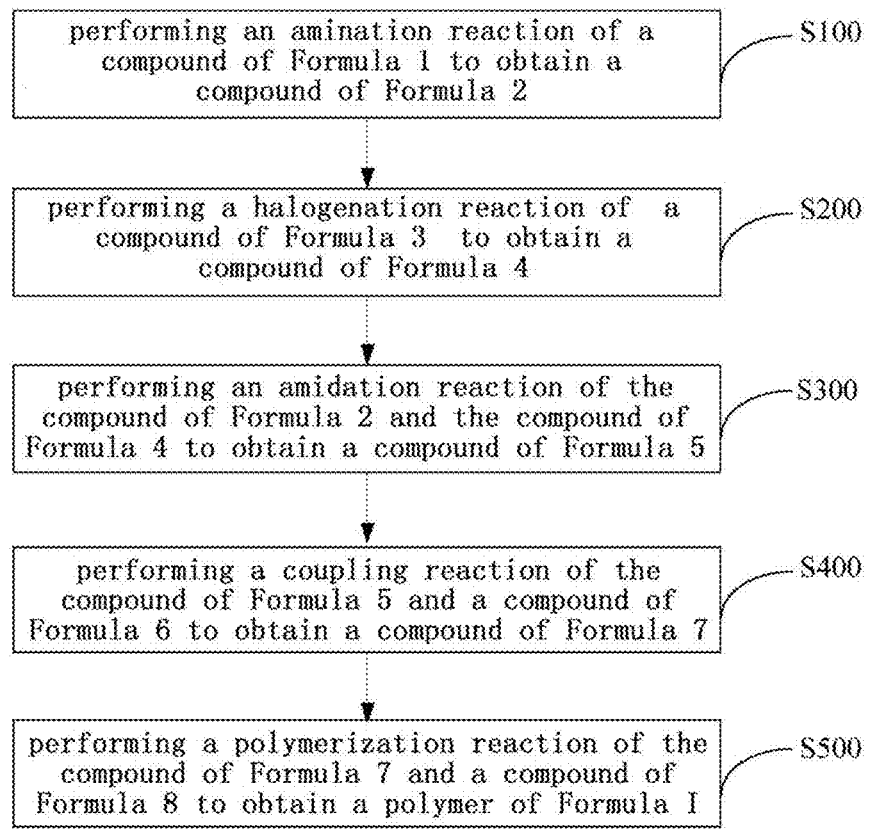
FIG. 1 shows a schematic flow diagram of a method for preparing a polymer according to one example of the present invention.

101: cathode 102: electron-transporting layer 103: light-absorbing active layer 104: hole-transporting layer 105: anode

DETAILED DESCRIPTION

The embodiments of the present invention are described in detail below. The embodiments described below are exemplary, and are used to explain the present invention only, and should not be construed as limiting the present invention. Where specific techniques or conditions are not indicated in the embodiments, they are performed according to the techniques or conditions described in the literature in the art or according to product specifications. If the reagents or instruments used do not indicate the manufacturers, they are all conventional products that can be purchased through the market.

Definitions and General Terms

Certain embodiments of the present invention are now described in detail, and examples thereof are illustrated by the accompanying structural Formulas and chemical Formula. The invention is intended to cover all alternatives, modifications, and equivalents, which are included within the scope of the invention as defined by the claims. Those skilled in the art will recognize that many methods and materials similar or equivalent to those described herein can be used to practice the present invention. The present invention is in no way limited to the methods and materials described herein. In the event that one or more of the incorporated literature, patents, and similar materials differs from or contradicts this application (including but not limited to defined terms, terminology applications, described technologies, etc.), it is based on this application.

It will be further appreciated that certain features of the invention have been described in various independent embodiments for clarity of the disclosure, but may also be provided in combination in a single embodiment. Conversely, various features of the invention are described in a single embodiment for the sake of brevity, but may also be provided separately or in any suitable subcombination.

Unless otherwise illustrated, all technical and scientific terms used herein have the same meaning as commonly understood by the person skilled in the art to which this invention belongs. All patents and publications referred to in this application are incorporated herein by reference in their entirety.

The following definitions used herein should be applied unless otherwise indicated. For the purposes of the present invention, the chemical elements are in accordance with the CAS of the Periodic Table of the Elements, and the "Handbook of Chemistry and Physics", 75th Edition, 1994. In addition, general principles of organic chemistry may be referred to the description in "Organic Chemistry", Thomas Sorrell, University Science Books, Sausalito: 1999, and "March's Advanced Organic Chemistry" by Michael B. Smith and Jerry March, John Wiley & Sons, New York: 2007, the entire content of which is incorporated herein by reference.

The articles "a", "an", and "the" as used herein are intended to include "at least one" or "one or more" unless specified otherwise or there is a clear conflict in the context. Thus, these articles used herein refer to articles of one or more than one (ie, at least one) objects. For example, "a component" refers to one or more components, that is, there may be more than one component that is considered to be employed or used in the described embodiments.

The term "comprising" is an open-ended expression that includes what is indicated in the present invention but does not exclude other aspects.

In addition, it should be noted that unless explicitly stated otherwise, the descriptions "Each . . . independently", " . . . is each independently" and " . . . independently" used in the present invention are interchangeable and should be construed broadly. That is, it can mean that in different groups, the specific options expressed between the same symbols do not affect each other, and it can also be expressed that in the same group, the specific options expressed between the same symbols do not affect each other.

In various parts of this specification, the substituents of the polymers disclosed in the present invention are disclosed according to the type or range of the groups. In particular, the invention includes each individual sub-combination of each member of types and ranges of these groups. For example, the term "$C_{1-6}$ alkyl" refers specifically to independently disclosed methyl, ethyl, $C_3$ alkyl, $C_4$ alkyl, $C_5$ alkyl, and $C_6$ alkyl.

In various parts of the invention, linking substituents are described. When the structure clearly requires a linking group, the Markush variables enumerated for that group are to be understood as linking groups. For example, if the structure requires a linking group and the Markush group definition for the variable lists "alkyl" or "aryl", it will be understood that "alkyl" or "aryl" represents an attached alkylene group or arylene group, respectively.

As used herein, the term "alkyl" or "alkyl group" refers to a saturated linear or branched monovalent hydrocarbon group, wherein the alkyl group may be optionally substituted with one or more substituents described herein. In one embodiment of the invention, the alkyl group contains 1 to 30 carbon atoms. In another embodiment, the alkyl group contains 1 to 12 carbon atoms; in yet another embodiment, the alkyl group contains 1 to 6 carbon atoms; in a further embodiment, the alkyl group contains 1 to 4 carbon atoms; in a further embodiment, the alkyl group contains 1 to 3 carbon atoms.

Examples of alkyl groups include, but are not limited to, methyl (Me, —$CH_3$), ethyl (Et, —$CH_2CH_3$), N-propyl (n-Pr, —$CH_2CH_2CH_3$), isopropyl (i-Pr, —$CH(CH_3)_2$), n-butyl (n-Bu, —$CH_2CH_2CH_2CH_3$), isobutyl (i-Bu, —$CH_2CH(CH_3)_2$), sec-butyl (s-Bu, —$CH(CH_3)CH_2CH_3$), t-butyl (t-Bu, —$C(CH_3)_3$), n-amyl (—$CH_2CH_2CH_2CH_2CH_3$), 2-pentyl (—$CH(CH_3)CH_2CH_2CH_3$), 3-pentyl (—$CH(CH_2CH_3)_2$), 2-methyl-2-butyl (—$C(CH_3)_2CH_2CH_3$), 3-methyl-2-butyl (—$CH(CH_3)CH(CH_3)_2$), 3-methyl-1-butyl (—$CH_2CH_2CH(CH_3)_2$), 2-methyl-1-butyl (—$CH_2CH(CH_3)CH_2CH_3$), n-hexyl (—$CH_2CH_2CH_2CH_2CH_2CH_{32}CH$), 2-hexyl (—$CH(CH_3)CH_2CH_2CH_2CH_3$), 3-hexyl (—$CH(CH_2CH_3)(CH_2CH_2CH_3)$), 2-methyl-2-pentyl (—$C(CH_3)_2CH_2CH_2CH_3$), 3-methyl-2-pentyl (—$CH(CH_3)CH(CH_3)CH_2CH_3$), 4-methyl-2-pentyl (—$CH(CH_3)CH_2CH(CH_3)_2$), 3-methyl-3-pentyl (—$C(CH_3)(CH_2CH_3)_2$), 2-methyl-3-pentyl (—$CH(CH_2CH_3)CH(CH_3)_2$), 2,3-dimethyl-2-butyl (—$C(CH_3)_2CH(CH_3)_2$), 3,3-dimethyl-2-butyl (—$CH(CH_3)C(CH_3)_3$), n-heptyl, n-octyl, and the like.

The term "alkylene" means a saturated divalent hydrocarbon radical resulting from the removal of two hydrogen atoms from a saturated straight-chain or branched hydrocarbon radical. The alkylene groups in the present invention include but are not limited to 1-20 carbon atoms. In one embodiment, an alkylene group contains 1-6 carbon atoms; in another embodiment, an alkylene group contains 1 to 4 carbon atoms; in yet another embodiment, an alkylene group contains 1 to 3 carbon atoms; in a further embodiment, the alkylene group contains 1 to 2 carbon atoms. Examples thereof include methylene (—$CH_2$—), ethylene (—$CH_2CH_2$—), isopropylene (—$CH(CH_3)CH_2$—), and the like. The alkylene group is optionally substituted with one or more substituents described herein.

The term "alkenyl" means a straight-chain or branched monovalent hydrocarbon radical of a carbon atom, which has at least one site of unsaturation, that is, there is a carbon-carbon $sp^2$ double bond, wherein the alkenyl group is optionally substituted with one or more substituents as described herein, and includes the positioning of "cis" and "tans" or the positioning of "E" and "Z". In one embodiment, the alkenyl group contains 2 to 8 carbon atoms; in another embodiment, the alkenyl group contains 2 to 6 carbon atoms; in yet another embodiment, the alkenyl group contains 2 to 4 carbon atoms. Examples of alkenyl groups include, but are not limited to, vinyl (—$CH=CH_2$), allyl (—$CH_2CH=CH_2$), and the like.

The term "alkynyl" means a linear or branched monovalent hydrocarbon radical of a carbon atom, which has at least one site of unsaturation, that is, there is one carbon-carbon sp triple bond, wherein the alkynyl group is optionally substituted with one or more substituents described herein. In one embodiment, the alkynyl group contains 2-8 carbon atoms; in another embodiment, an alkynyl group contains 2-6 carbon atoms; in yet another embodiment, an alkynyl group contains 2-4 carbon atoms. Examples of alkynyl groups include, but are not limited to, ethynyl (—C≡CH), propargyl (—$CH_2$C≡CH), 1-propynyl (—C≡C—$CH_3$), and the like.

Whether used alone or in combination with other terms, such as "carboxyalkyl", the term "carboxy" represents —$CO_2H$; whether used alone or in combination with other terms, such as "aminocarbonyl" or "acyloxy", the term "carbonyl" represents —(C=O)—.

The term "H" means a single hydrogen atom. Such atom can be attached to other groups, such as oxygen, to form a hydroxyl group.

The terms "halogen" and "halo" refer to fluorine (F), chlorine (Cl), bromine (Br), or iodine (I).

The term "ring" includes carbocyclic ring, heterocyclic ring, aromatic ring, heteroaromatic ring, spiro ring, fused ring, and the like, wherein the carbocyclic ring, heterocyclic ring, aromatic ring, heteroaromatic ring, spiro ring, fused ring group have the meaning as described in the present invention.

The term "aryl" refers to monocyclic ring, bicyclic ring, and tricyclic carbocyclic ring systems in which at least one of the ring systems is aromatic, wherein each ring system contains a ring of 3 to 7 atoms. The aryl group is usually, but not necessarily, linked to the parent molecule through the aromatic ring of the aryl group. The term "aryl" may be used interchangeably with the term "aromatic ring" or "aryl ring." Examples of aryl groups may include phenyl, naphthyl and anthracene. The aryl group is optionally substituted with one or more substituents described herein.

In one aspect of the invention, a polymer is provided. According to an embodiment of the present invention, the polymer has a structure shown in Formula I, Formula I

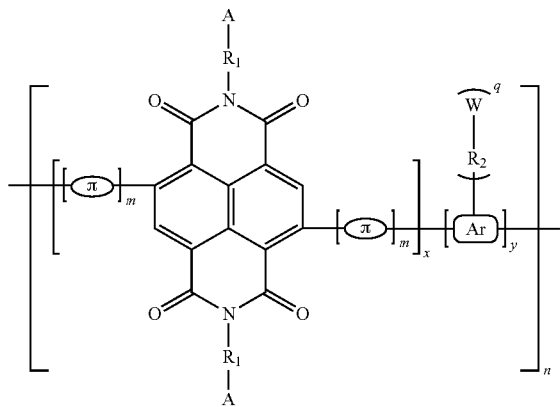

wherein, A and W are each independently a fluorinated group or an interface-modified functional group; $R_1$ and $R_2$ are each independently a substituted or unsubstituted alkylene group, in the substituted alkylene group, at least one hydrogen is substituted with at least one selected from the group consisting of a halogen atom, a hydroxyl group, an amino group, an alkenyl group, an alkynyl group, an aryl group, an ester group, a thiol group, a cyano group and a nitro group, and/or at least one methylene group is substituted with at least one selected from the group consisting of an oxygen atom, an imino group, a sulfone group, a carbonyl group, an alkenylene, an alkynylene, an arylene, —C(=O)O—, a sulfur atom and a nitroso group; Ar is an aromatic group; n is a conjugated group; m is an integer of 0 to 3; q is an integer of 0 to 2; $0 < x < 1$, $0 < y < 1$, and $x+y=1$; n is an integer of 1 to 10000. The inventors have found that the polymer according to an embodiment of the present invention has excellent interface-modified property, water resistance and/or excellent electron-transporting property, and thus can be effectively used to prepare solar cells, for example, used to prepare the electron transport layer of a solar cell. As a result, the polymer not only can significantly improve the hydrophobic property of the thin film surface, thereby protecting the intermediate active layer from moisture in the air so as to improve the lifetime of the cell device, but also can be used for large-area processing to prepare a flexible cell device.

In some embodiments of the present invention, the fluorinated group may be selected from the group consisting of perfluoro substituted hydrocarbon groups, fluorine substituted aromatic rings, fluorine substituted cyclic ethers, fluorine substituted aliphatic rings, and/or fluorine substituted bridged rings; the interface-modified functional group is selected from the group consisting of —$N(CH_3)_2$, —$N(CH_2CH_3)_2$, hydroxy, or/and methoxy. It should be noted that the perfluoro-substituted hydrocarbon group in the present invention includes a perfluoro-substituted alkyl group, a perfluoro-substituted alkenyl group, and/or a perfluoro-substituted alkynyl group. Thus, the hydrophobic property of the polymer can be further improved and when the polymer is used as an interface material in an optoelectronic device, the water resistance of the device in air can be improved.

In some embodiments of the present invention, $R_1$ and $R_2$ are each independently a substituted or unsubstituted $C_{1-20}$ alkylene group, and in the substituted $C_{1-20}$ alkylene group, hydrogen on at least one methylene group is substituted with at least one selected from the group consisting of a halogen atom, a hydroxyl group, an amino group, an alkenyl group, an alkynyl group, an aryl group, an ester group, a thiol group, a cyano group and a nitro group, and/or at least one methylene group is substituted with at least one selected from the group consisting of an oxygen atom, an imino group, a sulfone group, a carbonyl group, an alkenylene group, an alkynylene group, an arylene group, —C(=O)O—, a sulfur atom and a nitroso group. As a result, the properties of the polymer can be further improved.

According to an embodiment of the present invention, $R_1$ is a methylene group or a propylene group, A is a perfluorophenyl group or —$N(CH_3)_2$, or $R_1$ and A together constitute a perfluorooctyl group. Thus, the hydrophobic property of the polymer can be further improved, and when the polymer is used as an interface material in an optoelectronic device, the water resistance of the device in air can be improved.

According to an embodiment of the present invention, $R_2$ is hexylene, dodecylene, or —$(CH_2CH_2)_r$—, W is —$N(CH_2CH_3)_2$, or —$N(CH_3)_2$, or $R_2$ and W together form a perfluorooctyl group, wherein r is an integer of 1 to 20. Thus, the hydrophobic property of the polymer can be further improved, and when the polymer is used as an interface material in an optoelectronic device, the water resistance of the device in air can be improved.

In some embodiments of the present invention, Ar may be at least one selected from the group consisting of the following structural Formulas:

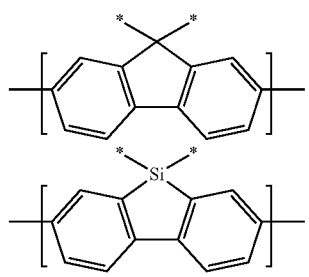

-continued
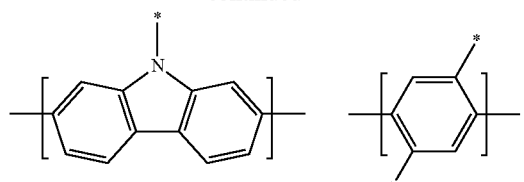
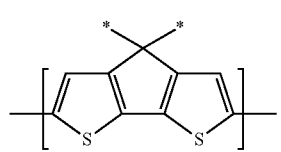
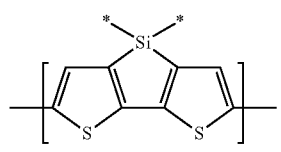
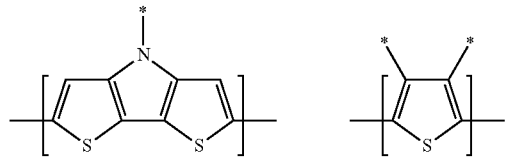
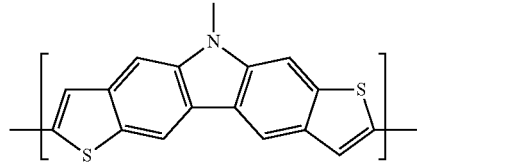
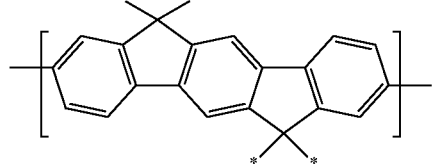
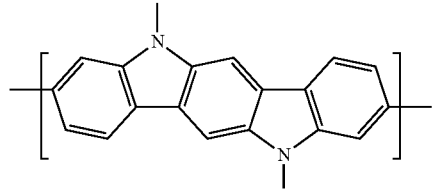
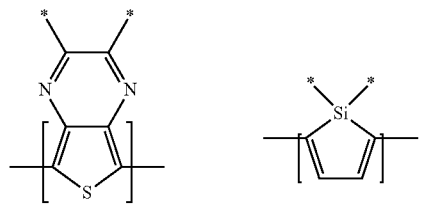
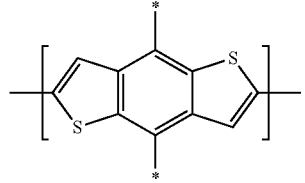
-continued
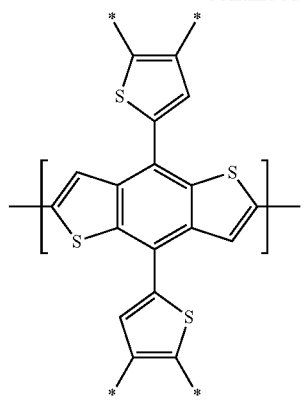
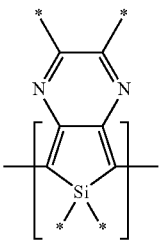
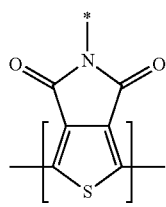
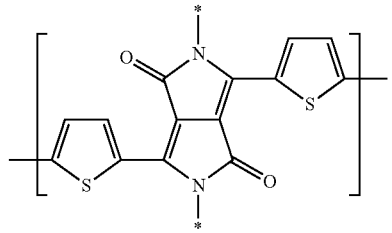
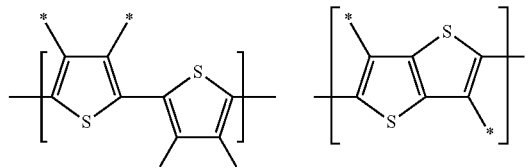
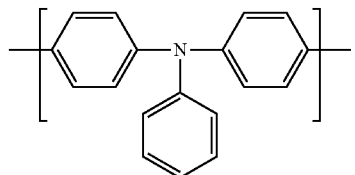
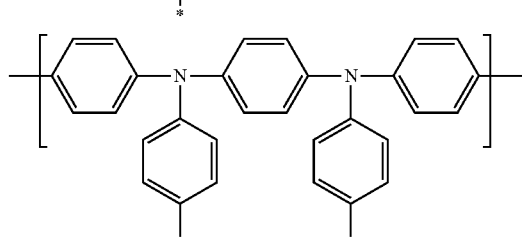
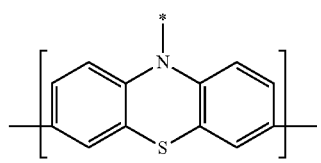
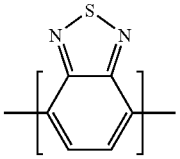

-continued
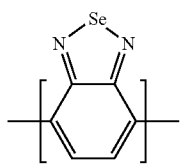
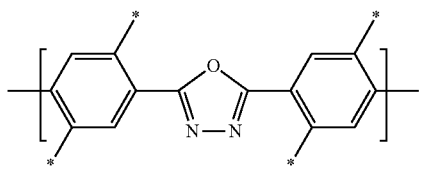
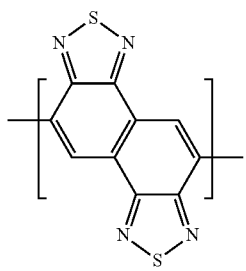
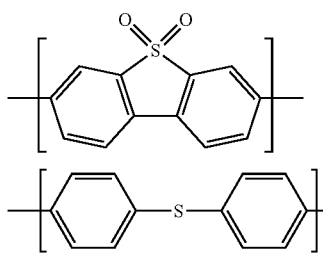
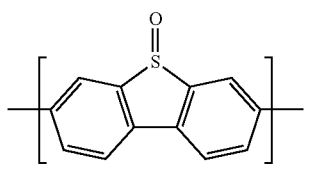
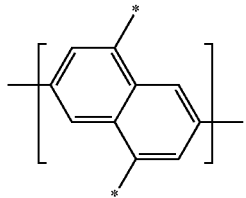
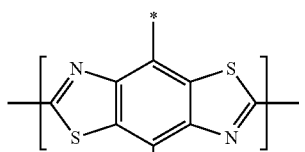
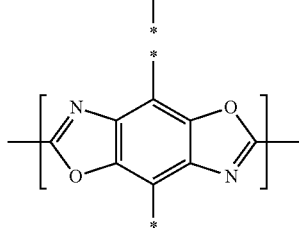
-continued
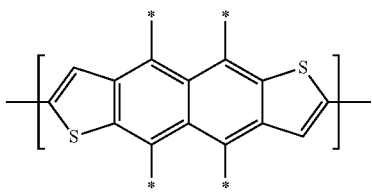
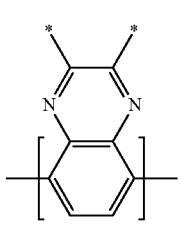
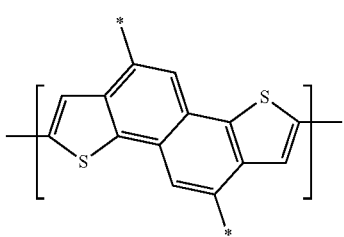
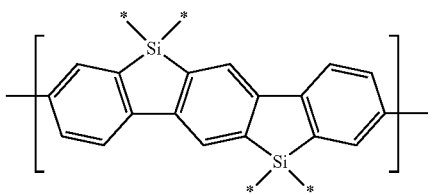
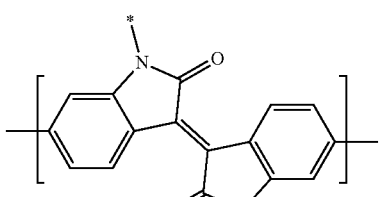
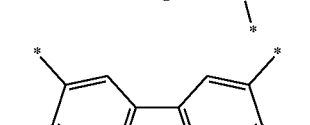
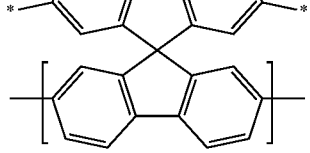
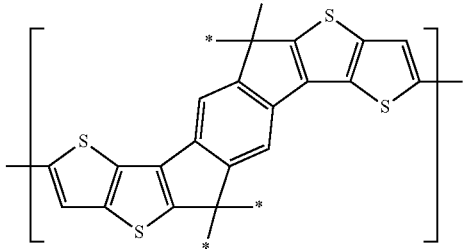

-continued

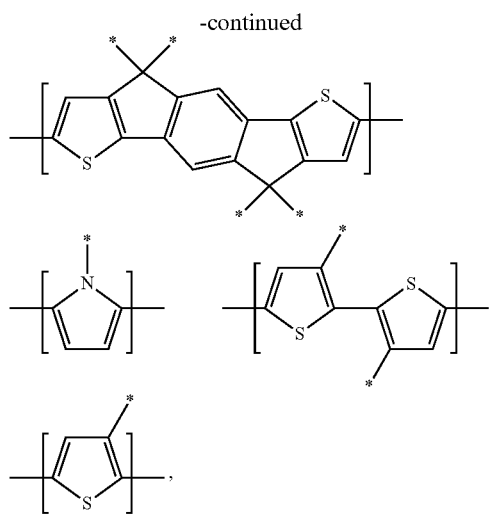

wherein * represents a side chain attachment site. As a result, the properties of the polymer can be further improved.

According to an embodiment of the present invention, Ar is

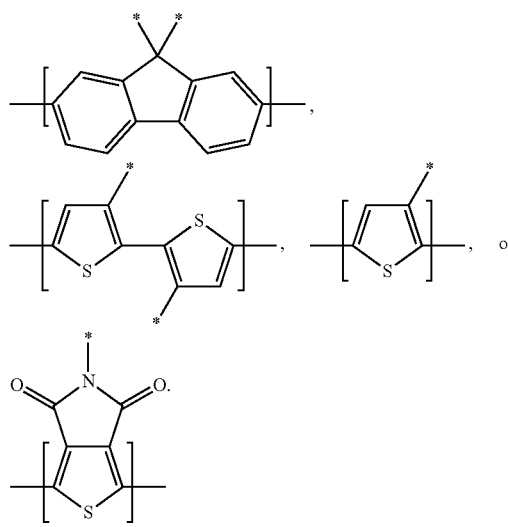

As a result, the properties of the polymer can be further improved.

In some embodiments of the present invention, π may be selected from the group consisting of a benzene ring bridge, a naphthalene ring bridge, a pyridine bridge, a pyrazine bridge, an alkenylene group, an alkynylene group, a thiophene bridge, a thiophthene bridge, a selenophene bridge, a tellurophene bridge, a furan bridge, a pyrrole bridge, a silole bridge, a thiazole bridge, an oxazole bridge and a triazole bridge. It should be noted that the benzene ring bridge, the naphthalene ring bridge, the pyridine bridge, the pyrazine bridge, the thiophene bridge, the thiophthene bridge, the selenophene bridge, the tellurophene bridge, the furan bridge, the pyrrole bridge, the silole bridge, the thiazole bridge, the oxazole bridge and the triazole bridge according to the present invention all refer to a group having two free radicals that can be linked to two groups. As a result, the properties of the polymer can be further improved.

According to an embodiment of the present invention, π may be at least one selected from the following structural Formulas:

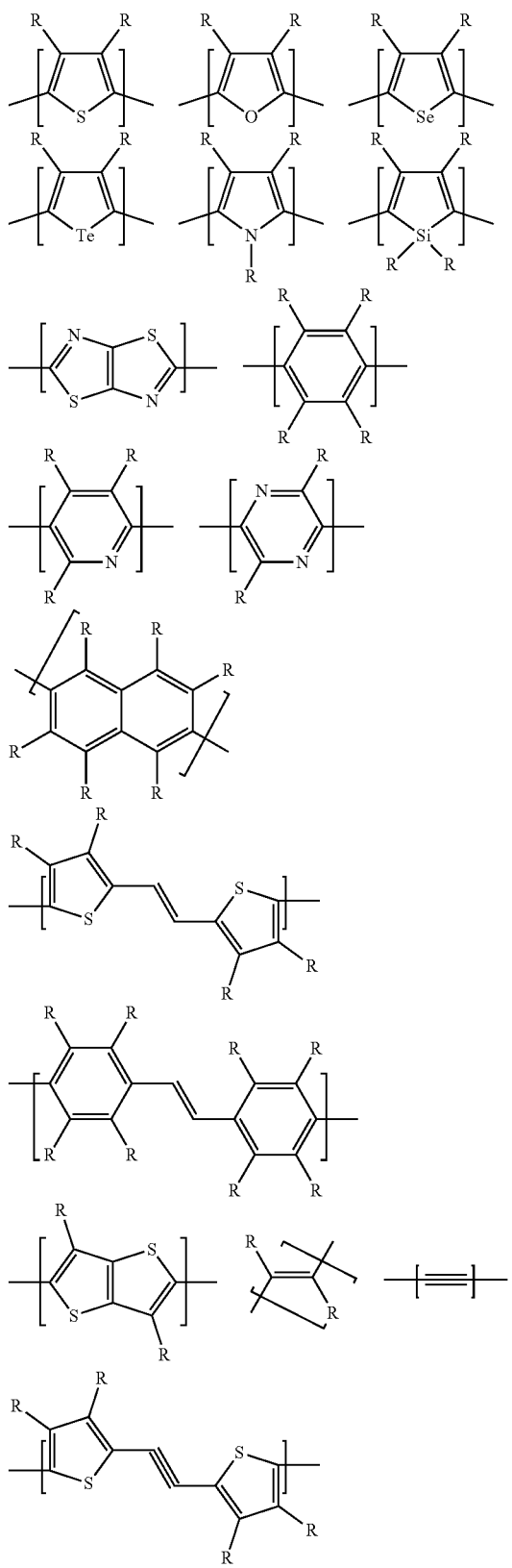

-continued

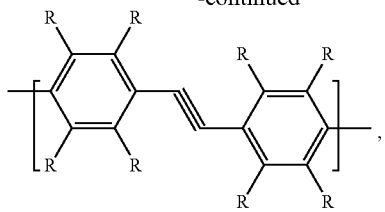

wherein each R is independently a hydrogen or a substituted or unsubstituted $C_{1-20}$ alkyl group, and in the substituted $C_{1-20}$ alkyl group, at least one hydrogen is substituted with at least one selected from the group consisting of a halogen atom, a hydroxyl group, an amino group, an alkenyl group, an alkynyl group, an aryl group, an ester group, a thiol group, a cyano group and a nitro groups, and/or at least one methylene group is substituted with at least one selected from the group consisting of an oxygen atom, an imino group, a sulfone group, a carbonyl group, an alkenylene group, an alkynylene group, an arylene group, —C(=O) O—, a sulfur atom and a nitroso group. Preferably, at least one hydrogen atom is substituted with a halogen atom, an alkenyl group, an alkynyl group, an aryl group, a hydroxyl group, an amino group, a carboxyl group, an ester group, a cyano group or a nitro group. As a result, the properties of the polymer can be further improved.

According to an embodiment of the present invention, π is

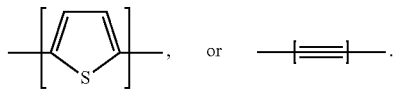

As a result, the properties of the polymer can be further improved.

According to an embodiment of the present invention, the polymer has one of the following structures:

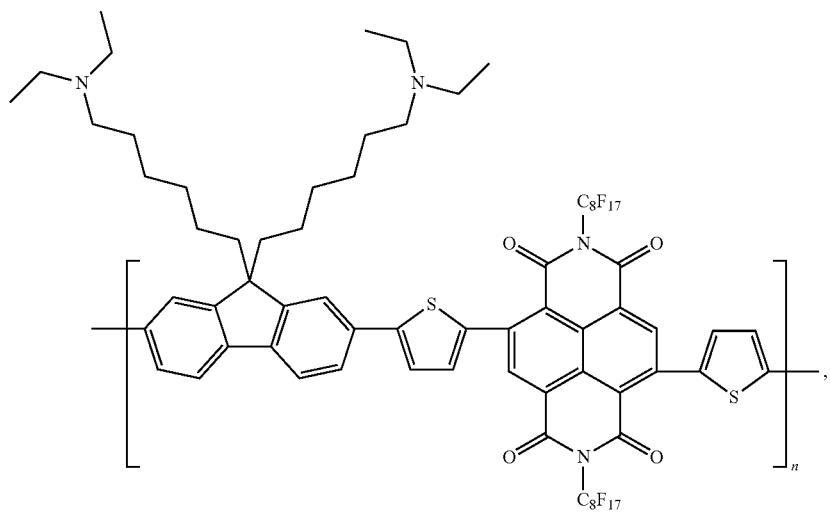

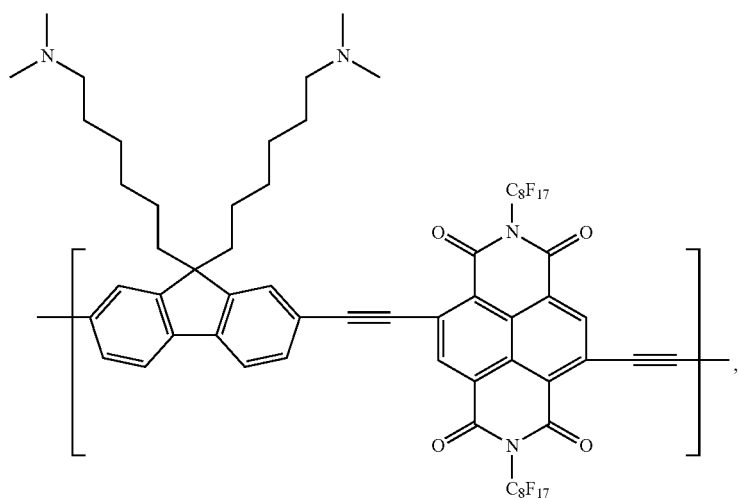

-continued

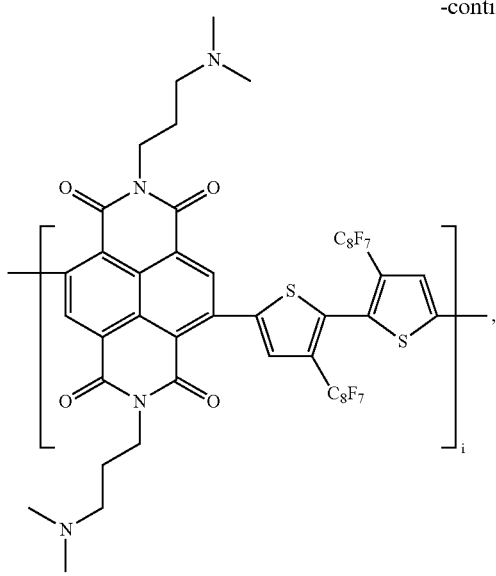

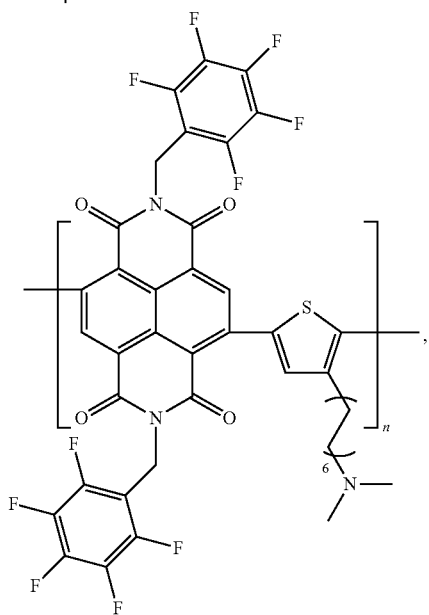, and 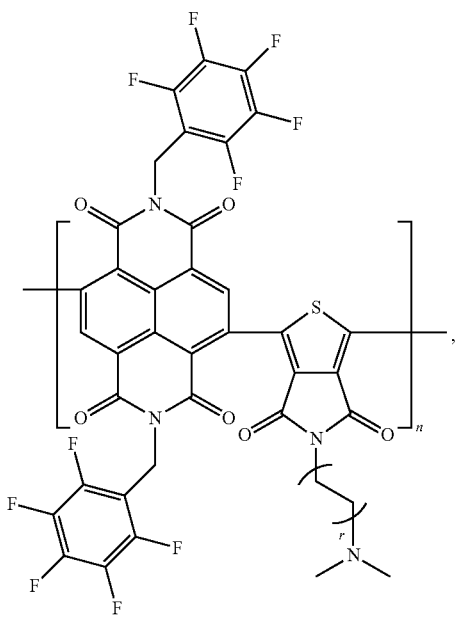

wherein n is an integer of 1 to 20. As a result, the properties of the polymer can be further improved.

In another aspect of the present invention, the present invention provides a method of preparing the polymer described above. According to an embodiment of the present invention, referring to FIG. 1, the method includes the following steps:

S100: performing an amination reaction of a compound of Formula 1 to obtain a compound of Formula 2;

 Formula 1

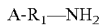 Formula 2

In some embodiments of the present invention, the compound of Formula 1 may be perfluorooctyl iodide. As a result, the properties of the polymer can be further improved.

According to an embodiment of the present invention, the specific steps and specific conditions such as reaction temperature, solvent, molar ratio of each reactants, pH, reaction time, catalyst, and the like of the amination reaction of the compound of Formula 1 are not particularly limited, and as long as the requirements are met, those skilled in the art can flexibly select them according to requirements.

In some embodiments of the present invention, the above amination reaction may be performed according to the following steps: the compound of Formula I is reacted with potassium phthalimide for 3 to 10 hours in a nitrogen atmosphere in a first organic solvent under stirring, and the reaction temperature may be 90° C. to 120° C., wherein the specific type of the first organic solvent is not particularly limited as long as it can effectively dissolve the reactants so that the reaction proceeds smoothly, and examples thereof include but are not limited to anhydrous DMF, and the like, and the ratio of the compound of Formula 1 and potassium phthalimide is also not particularly limited and can be selected by a person skilled in the art according to needs, and for example may include but is not limited to 1:0.9 to 1.1. Next, the product obtained above and a hydrazine hydrate are heated with reflux overnight in a nitrogen atmosphere in a second organic solvent under stirring, wherein the specific type of the second organic solvent is not particularly limited as long as it can effectively dissolve the reactants so that the reaction proceeds smoothly, examples thereof include but are not limited to anhydrous ethanol, and the like. The method for providing the hydrazine hydrate is not particularly limited, and the hydrazine hydrate may be an aqueous solution having a mass fraction of 40% to 80%, and the ratio of the above-obtained product to hydrazine hydrate is also not particularly limited and may be selected by a person skilled in the art according to needs, and for example may include but not limited to 1 mol: 25-35 ml. Under the above conditions, the reaction can be smoothly carried out, the reaction conditions are mild, easy to be implemented and controlled, and the yield and purity of the product are high.

In a specific embodiment of the present invention, the conditions and steps of the amination reaction of the compound of Formula 1 may be as follows: nitrogen is blown into a 250 mL three-necked flask with a magnetic stirrer for 10 minutes, then the flask is added 10.92 g (20 mmol) of perfluorooctyl iodide as raw material, 4.07 g (22 mmol) of potassium phthalimide, and 80 mL of anhydrous DMF, the mixture is heated to 110° C. with stirring under a nitrogen atmosphere, and the reaction is maintained for 6 hours. After the reaction is completed, the reaction solution is concentrated by distillation under reduced pressure and the resulting concentrated solution is eluted with dichloromethane, and columned on silica gel to give a product 6 g in 53% yield. The above-mentioned reaction product, 5.65 g (10 mmol), 30 mL hydrazine hydrate with a mass fraction of 80%, and 60 mL anhydrous ethanol are added to a 250 mL three-necked flask with a magnetic stirrer, nitrogen is bubbled in for 10 minutes, the mixture is heated to reflux under a nitrogen atmosphere, and the reaction is stirred overnight. After the reaction is completed, the reaction solution is concentrated, and suctioned, dissolved and concentrated in a small amount of ethanol, and repeated for three times. After the reaction solution is dried, a colorless, yellowish liquid of 2.3 g is obtained with a yield of 53%. Thus, the operation is simple, convenient, easy to implement, and easy to industrial production.

S200: performing a halogenation reaction of a compound of Formula 3 to obtain a compound of Formula 4;

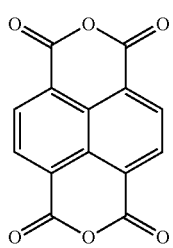

Formula 3

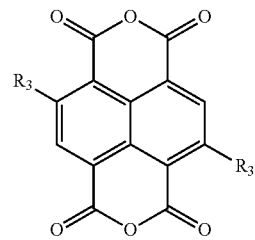

Formula 4

According to an embodiment of the present invention, specific conditions and specific steps for the halogenation reaction of the compound of Formula 3 are not limited, and as long as the requirements are satisfied, and those skilled in the art can flexibly select according to needs.

In some embodiments of the present invention, the above halogenation reaction may be performed according to the following steps: the compound of Formula 3 is reacted with dihalo isocyanuric acid for 7 to 14 hours in the presence of concentrated sulfuric acid (97%) and under stirring, the reaction temperature may be 110° C. to 140° C., wherein the specific type of dihalo isocyanuric acid is not particularly limited as long as the reaction proceeds smoothly, and examples thereof include but not limited to dibromoisocyanuric acid. The ratio of the compound of Formula 3 and the dihalo isocyanuric acid is also not particularly limited, those skilled in the art can select it according to needs, and the examples thereof may include but is not limited to 1:1.85 to 2.05. Under the above conditions, the reaction can be smoothly carried out, the reaction conditions are mild, easy to be implemented and controlled, and the yield and purity of the product are high.

In a specific embodiment of the present invention, the specific conditions and specific steps for the halogenation reaction of the compound of Formula 3 may be as follows: a 100 mL round bottom flask with a magnetic stirrer is added with 6.3 g (21.9 mmol) of dibromoisocyanuric acid and 18 mL of concentrated sulfuric acid (97%), and 18 mL of concentrated sulfuric acid (97%) suspended with 3 g (11.2 mmol) of 1,4,5,8-naphthalene tetracarboxylic anhydride is slowly dropped into the above round bottom flask. The mixture is stirred and heated to 130° C. and the reaction is maintained for 10 hours. After the reaction is completed, it is cooled, filtered, washed for three times and then vacuum dried to obtain 4.7 g of product.

S300: performing an amidation reaction of the compound of Formula 2 and the compound of Formula 4 to obtain a compound of Formula 5;

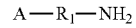

Formula 2

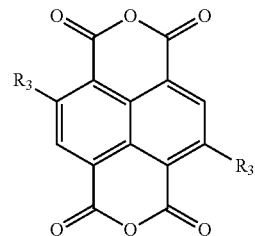

Formula 4

-continued

Formula 5

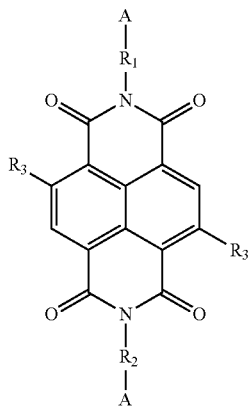

In some embodiments of the present invention, the compound of Formula 4 may be 2,6-dibromo-1,4,5,8-naphthalenediimide. As a result, the properties of the polymer can be further improved.

According to an embodiment of the present invention, the specific conditions and specific steps for the amidation reaction between the compound of Formula 2 and the compound of Formula 4 are not limited, and as long as the requirements are satisfied, those skilled in the art can select it flexibly according to needs.

In some embodiments of the present invention, the above amidation reaction can be performed according to the following steps: the compound of Formula 2 is reacted with the compound of Formula 4 for 2-9 hours in a nitrogen atmosphere in an organic solvent and in the presence of an acid under stirring, and the reaction temperature may be 90° C. to 120° C., wherein the specific types of the organic solvent and the acid are not particularly limited as long as they can effectively dissolve the reactants so that the reaction proceeds smoothly. Example of the organic solvent includes but is not limited to anhydrous NMP, and the like, and the example of the acid includes but is not limited to acetic acid and the like. The ratio of the compound of Formula 2 and the compound of Formula 4 is also not particularly limited, for example, may include but is not limited to 1.9-2.2:1, and those skilled in the art can select according to needs. Under the above conditions, the reaction can be smoothly carried out, the reaction conditions are mild, easy to be implemented and controlled, and the yield and purity of the product are high.

In a specific embodiment of the present invention, the specific conditions and specific steps of the amidation reaction occurred between the compound of Formula 2 and the compound of Formula 4 may be as follows: 0.85 g (2 mmol) of 2,6-dibromo-1,4,5,8-naphthalenediimide is added to a 150 mL two-neck round bottom flask with a magnetic stirrer, to which nitrogen is passed for 10 min and 30 mL of anhydrous NMP is added, and the 2,6-dibromo-1,4,5,8-naphthalenediimide is dissolved under stirring. Under a nitrogen atmosphere, 1.76 g (4.1 mmol) of perfluorooctylamine and 15 mL of acetic acid are added and the mixture is stirred and heated to 110° C. and is reacted for 5 hours. After the reaction is completed, the reaction solution is poured into a 2N hydrochloric acid solution. After the reaction solution is filtrated and dried, a crude product is obtained. Then, the crude product is eluted with chloroform and columned on silica gel to give 1.94 g of a yellow solid with a yield of 77%. Thus, the operation is simple, convenient, easy to be implemented, and easy to industrial production, and the yield is high.

S400: performing a coupling reaction of the compound of Formula 5 and a compound of Formula 6 to obtain a compound of Formula 7;

Formula 5

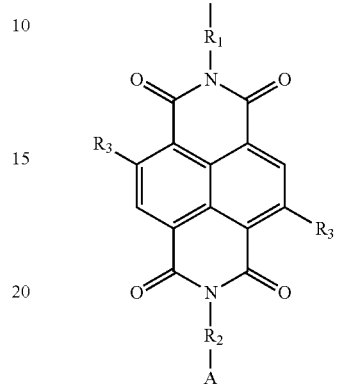

Formula 6

Π—Sn(Bu)₃

Formula 7

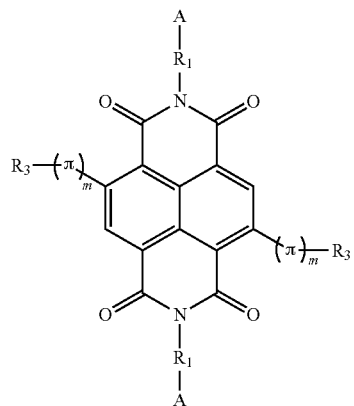

In some embodiments of the present invention, the compound of Formula 6 may be tributyltin thiophene. As a result, the properties of the polymer can be further improved.

According to an embodiment of the present invention, the specific conditions and specific steps for the coupling reaction between the compound of Formula 5 and the compound of Formula 6 are not limited, and as long as the requirements are satisfied, those skilled in the art can flexibly select according to needs.

In some embodiments of the present invention, the above coupling reaction may be performed according to the following steps: the compound of Formula 5 is reacted with the compound of Formula 6 for 2 to 9 hours in a nitrogen atmosphere in an organic solvent in the presence of a catalyst under stirring, and the reaction temperature may be 80° C. to 110° C., wherein the specific type of the organic solvent is not particularly limited as long as it can effectively dissolve the reactants so that the reaction proceeds smoothly, and examples thereof include but are not limited to toluene-chloroform (5:3 volume ratio) mixtures and the like, and the specific type of catalyst is also not particularly limited as long as the reaction proceeds smoothly, and examples thereof include but are not limited to tetraphenylphosphine palladium and the like. The ratio of the compound of Formula 5 and the compound of Formula 6 is also not particularly limited and for example may include but not limited to 1:2.5-2.7, and those skilled in the art can select according to needs; next, the above-obtained product is allowed to react with NBS for two days in the dark in the second organic solvent under stirring, wherein the specific type of the second organic solvent is not particularly limited as long as it can effectively dissolve the reactants so that the reaction proceeds smoothly, and examples thereof include but are not limited to DMF-chloroform (2:1 volume ratio) mixtures and the like. The ratio of the above-obtained product to hydrazine hydrate is also not particularly limited, and those skilled in the art can select according to needs. For example, the ratio of the above-obtained product to hydrazine hydrate may include but is not limited to 1 mmol: 0.382-0.402 g. Under the above conditions, the reaction can be smoothly carried out, the reaction conditions are mild, easy to be implemented and controlled, and the yield and purity of the product are high.

In a specific embodiment of the present invention, the specific conditions and specific steps for the coupling reaction between the compound of Formula 5 and the compound of Formula 6 may be as follows: 2,6-dibromo-N,N'-bisperfluorooctyl-1,4,5,8-naphthalenediimide (1.94 g, 1.5 mmol) is added to a 100 mL two-port bottle with a stirrer, to which nitrogen is passed for 10 minutes. 25 mL of clean toluene and 15 mL of chloroform are added to the reaction flask, and stirred for dissolving. Under nitrogen protection, 1.5 g (4 mmol) of the tributyltin thiophene is added, then, the catalyst tetraphenylphosphine palladium is added, and the mixture is stirred and heated to 90° C. and reacted for 5 hours. After the reaction is completed, the mixture is poured into an aqueous solution of ammonium chloride, extracted with dichloromethane, dried, and concentrated by suction, the resulting solid is eluted using dichloromethane, and is columned on silica gel, and the resulting solid is recrystallized with a methanol-chloroform to give 1.6 g of a red pure product with a yield of 85%. 1.27 g (1 mmol) of this product is added to a 250 mL two-necked flask with a stirrer, 20 mL of DMF and 60 mL of chloroform are added, and the mixture is stirred and dissolved, then, 0.392 g of NBS is dissolved in a mixed solvent of 20 mL of chloroform and 40 mL of DMF, and slowly added dropwise to the reaction flask under an ice bath, and the reaction is carried out in the dark for two days. After the reaction is completed, the mixture is concentrated to a solid, the solid is eluted with dichloromethane, and columned on silica gel, and the resulting solid is recrystallized with acetone-chloroform to give 1.37 g of red needle crystals with a yield of 96%. Thus, the operation is simple, convenient, easy to be implemented, and easy to industrial production, and the yield is high.

S500: performing a polymerization reaction of the compound of Formula 7 and a compound of Formula 8 to obtain a polymer of Formula I.

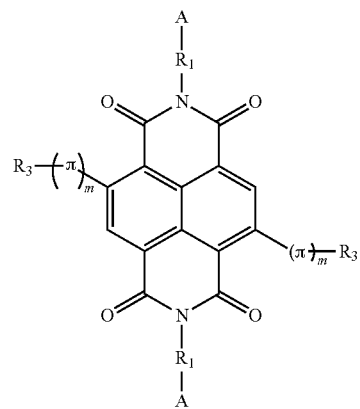

Formula 7

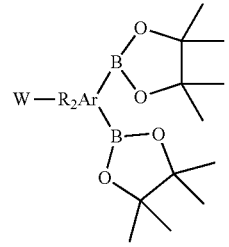

Formula 8

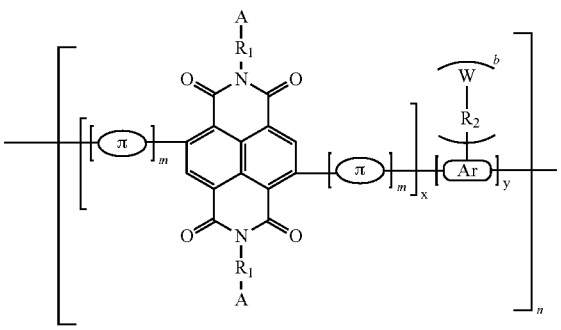

Formula 9

In some embodiments of the present invention, the compound of Formula 8 may be 2,7-bis (trimethylene boronate)-9,9'-(N,N-diethylhexyl-6-amino) fluorene. As a result, the properties of the polymer can be further improved.

According to an embodiment of the present invention, the specific conditions and specific steps of the polymerization reaction between the compound of Formula 7 and the compound of Formula 8 are not limited as long as the requirements are satisfied, and those skilled in the art can select flexibly according to needs.

In some embodiments of the present invention, the above polymerization reaction can be performed according to the following steps: the compound of Formula 7 is reacted with the compound of Formula 8 for 0.5 to 2 hours in an organic solvent under basic conditions in the presence of a catalyst and under stirring, and the reaction temperature may be 90° C. to 120° C., wherein the specific type of the organic solvent is not particularly limited as long as it can effectively dissolve the reactants so that the reaction proceeds smoothly, and examples thereof include but not limited to tetrahydrofuran-toluene (volume ratio 1:2) mixture and the like; and the specific type of the catalyst is not particularly limited as long as the reaction proceeds smoothly, and examples thereof include but not limited to tetratriphenylphosphine palladium. The ratio of the compound of Formula 7 and the compound of Formula 8 is also not particularly limited, and those skilled in the art can select according to needs. For example, the ratio of the compound of Formula 7 and the compound of Formula 8 may include but not limited to, 2.0 g to 1.8 g:1 g. Under the above conditions, the reaction can be smoothly carried out, the reaction conditions are mild, easy to be implemented and controlled, and the yield and purity of the product are high.

In some embodiments of the present invention, the specific conditions and specific steps for the polymerization reaction between the compound of Formula 7 and the compound of Formula 8 may be as follows: 0.712 g of 2,6-(Bis-5-bromo-2-thienyl)-N,N-diperfluorooctyl-1,4,5,8-naphthalenediimide and 0.364 g of 2,7-bis (trimethylene boronate)-9,9'-(N,N-diethylhexyl-6-amino) fluorene are added to a 15 mL thick-walled pressureproof tube with a stirrer, and then 1 mL of 20% tetrabutylammonium hydroxide solution, 2 mL of purified tetrahydrofuran and 4 mL of clean toluene, and 25 mg of catalyst tetratriphenylphosphine palladium are added to the tube. The tube is purged with nitrogen for 20 minutes, sealed, stirred and heated to 110° C. for 1 hour. The reaction solution is precipitated into methanol to obtain a crude product, which is then filtered and dried. Then, the polymer is washed with acetone in a Soxhlet extractor for 24 hours. Then, the target polymer is extracted again with chloroform to give 0.76 g of a polymer with a yield of 86%. Mn=19000, PDI=1.7. Thus, the operation is simple, convenient, easy to be implemented, and easy to industrial production, and the yield is high.

According to an embodiment of the present invention, the degree of polymerization and the dispersion coefficient of the polymer of the present invention can be characterized by gel permeation chromatography, and the spectral properties of the polymer can be tested by an ultraviolet-visible spectrometer.

In yet another aspect of the present invention, the present invention provides a solar cell. According to an embodiment of the present invention, the solar cell contains the polymer described above. The inventors have found that the solar cell has all the features and advantages of the previously described polymer and will not be further described here.

Figure 2:
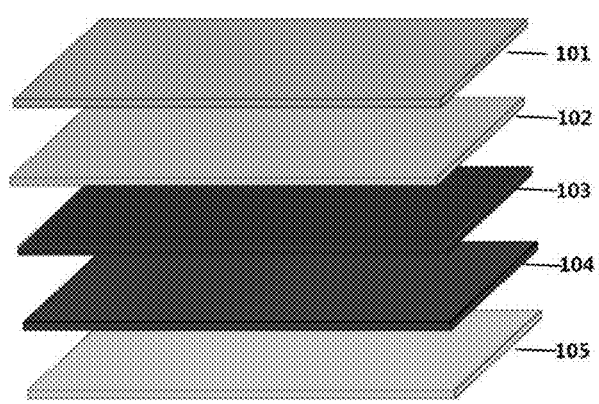
FIG. 2 shows a schematic structural view of a solar cell according to one example of the present invention.

According to an embodiment of the present invention, referring to FIG. 2, the specific structure of the solar cell includes: a cathode 101; an electron-transporting layer 102 disposed on one side of the cathode and containing the polymer described above; a light-absorbing active layer 103 disposed on the side of the electron-transporting layer 102 away from the cathode 101; a hole-transporting layer 104 disposed on the side of the light-absorbing active layer 103 away from the electron-transporting layer 102; an anode 105 disposed on the side of the hole-transporting layer 104 away from the light-absorbing active layer 103.

The electron-transporting layer can be prepared by coating a solution obtained by dissolving the above-mentioned polymer prepared in the present invention in a solvent on the light-absorbing active layer 103. The solvent is not particularly limited as long as it can dissolve the polymer of the present invention. Examples of solvents include the mixed solvents such as chlorobenzene and fluorobenzene, chloroform and fluorobenzene, dichlorobenzene and fluorobenzene, toluene and fluorobenzene, and toluene/fluorobenzene (2:1 by volume), chlorobenzene and fluorobenzene (2:0.5 by volume), chloroform and fluorobenzene (1.5:1 by volume) or dichlorobenzene and fluorobenzene (3:1 by volume) is preferable. The concentration of the polymer in the above solvent is preferably in the range of 1 mg/mL to 80 mg/mL, for example, the concentration of the polymer in the above solvent may be 80 mg/mL, 40 mg/mL, and 70 mg/mL.

According to an embodiment of the present invention, a light-absorbing active layer obtained is not affected by the moisture in the air, has a relatively high lifetime, superior electron-transporting properties, and can be used for large-area processing to prepare a flexible cell device. In some embodiments of the present invention, the electron-transporting layer in the solar cell contains the polymer described above. As a result, the light-absorbing active layer in the solar cell is not affected by the moisture in the air, has a relatively high lifetime, superior electron-transporting properties, and can be used for large-area processing and production.

According to an embodiment of the present invention, the light-absorbing active layer contains a perovskite material. Thus, the light-absorbing active layer can be solution-processed, the material is inexpensive, is easily available, has strong absorption, high carrier mobility, long life, and is easy to industrialize. In addition, since the electron-transporting layer contains the aforementioned polymer, the light-absorbing active layer cannot be affected by the moisture in the air, and the stability is greatly improved.

According to the embodiment of the present invention, the specific materials of the cathode, the hole-transporting layer, and the anode are not particularly limited, and as long as the requirements are met, those skilled in the art can flexibly select according to needs.

The embodiments of the present invention are described in detail below.

Example 1

Preparation of Perfluorooctylamine

The chemical reaction scheme is shown below and the specific reaction steps and reaction conditions are as follows:

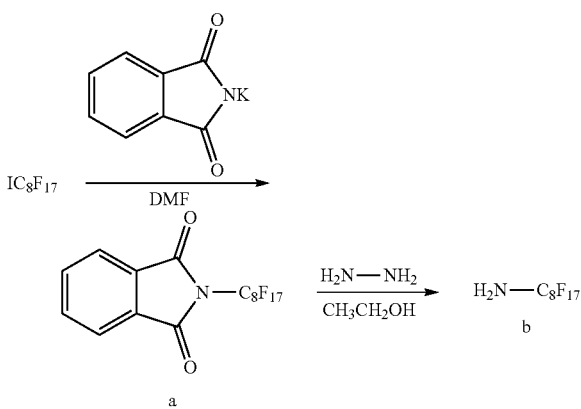

(1) Preparation of Monomer N-Perfluorooctyl Benzoimide a

A 250 mL three-necked flask with a magnetic stirrer is taken, and purged with nitrogen for 10 min. After the addition of 10.92 g (20 mmol) of Perfluorooctane iodide as starting material and 4.07 g (22 mmol) of potassium phthalimide, 80 mL of anhydrous DMF is added. The mixture is heated to 110° C. with stirring under a nitrogen atmosphere, and the reaction is maintained for 6 hours. After the reaction is completed, the reaction solution is concentrated by distillation under reduced pressure, the resulting concentrate is eluted with dichloromethane and columned on silica gel to give 6 g of a product with a yield of 53%.

(2) Preparation of Monomer Perfluorooctylamine b 5.65 g (10 mmol) of monomer a, 30 mL of hydrazine hydrate with a mass fraction of 80% and 60 mL of anhydrous ethanol are added to a 250 mL three-necked flask with a magnetic stirrer, and the mixture was bubbled with nitrogen for 10 minutes and then heated to reflux under a nitrogen atmosphere. The reaction was stirred overnight. After the reaction is completed, the reaction solution is concentrated, filtered, dissolved in a small amount of ethanol, and then concentrated, and thus repeated for three times. After drying, a colorless, yellowish liquid of 2.3 g is obtained with a yield of 53%.

Example 2

Preparation of 2,6-(bis-5-bromo-2-thienyl)-N,N'-diperfluorooctyl-1,4,5,8-naphthalenediimide (simply referred to as DBrNDITFO)

The chemical reaction scheme is shown below and the specific reaction steps and reaction conditions are as follows:

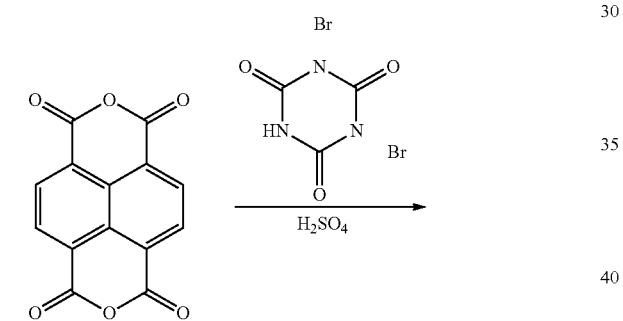

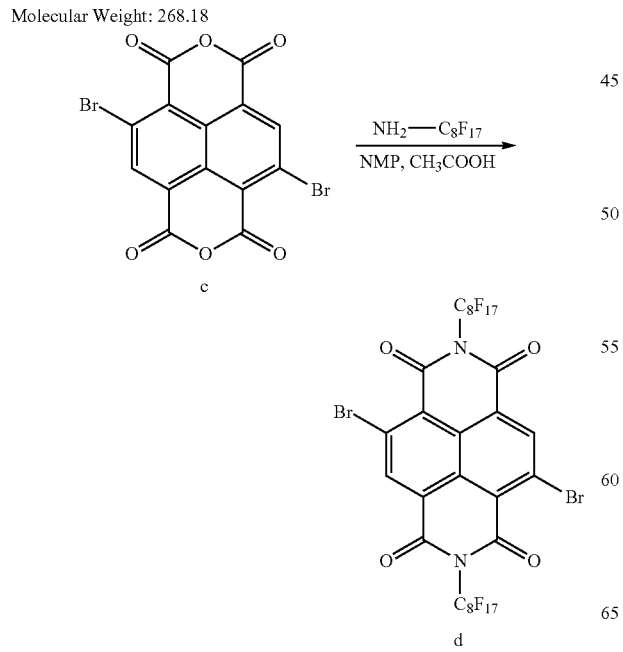

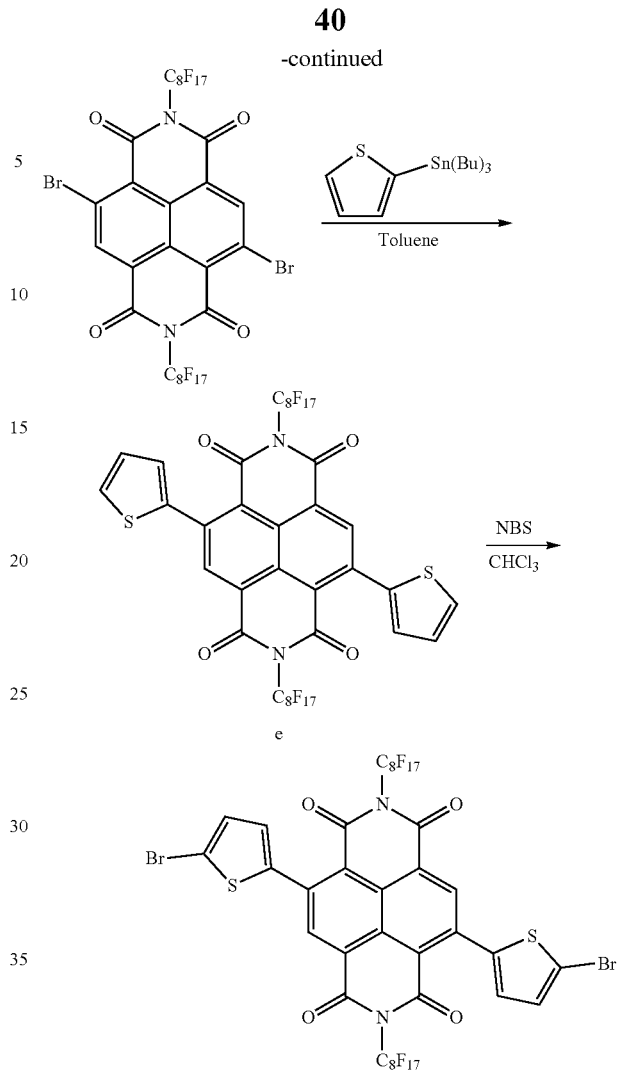

(3) Preparation of Monomer 2,6-dibromo-1,4,5,8-naphthalene tetracarboxylic anhydride A 100-mL round bottom flask with a magnetic stirrer was added with 6.3 g (21.9 mmol) of dibromoisocyanuric acid, and 18 mL of concentrated sulfuric acid (97%), and 18 mL of concentrated sulfuric acid (97%) suspended with 3 g (11.2 mmol) of 1,4,5,8-naphthalene tetracarboxylic anhydride was slowly dropped into the above round bottom flask. The mixture is stirred and heated to 130° C. and the reaction is maintained for 10 hours. After the reaction is completed, it is cooled, filtered, washed for three times and vacuum dried to give 4.7 g of product.

(4) Preparation of Monomer 2,6-dibromo-N,N'-diperfluorooctyl-1,4,5,8-naphthalenediimide 0.85 g (2 mmol) of monomer c is added into a 150 mL two-necked round bottom flask with a magnetic stirrer, nitrogen is passed for 10 min, 30 mL of anhydrous NMP is added, and the mixture is stirred and dissolved. Under a nitrogen atmosphere, 1.76 g (4.1 mmol) of monomer b and 15 mL of acetic acid are added, the mixture is stirred and heated to 110° C., and the reaction is proceeded for 5 hours. After the reaction is completed, the reaction solution is poured into a 2N hydrochloric acid solution. After filtration and drying, the crude product is obtained, which is then eluted with chloroform, and columned on silica gel to give 1.94 g of a yellow solid with a yield of 77%.

(5) The Monomer 2-Tributyltin Thiophene is Prepared According to the Method Disclosed in the Literature [Synthetic Metals 2006, 156(2-4), 166-175]

(6) Preparation of Monomer 2,6-(bis-2-thienyl)-N, N'-diperfluorooctyl-1,4,5,8-naphthalenediimide 2.64 g (1.5 mmol) of 2,6-dibromo-N,N'-diperfluorooctyl-1,4,5,8-naphthalenediimide is added to a 100 mL two-necked flask with a stirrer, after nitrogen is passed for 10 minutes, 25 mL of clean toluene and 15 mL of chloroform are added to the reaction flask, stirred and dissolved. Under nitrogen protection, 1.5 g (4 mmol) of tributyltin thiophene is added, then, the catalyst tetraphenylphosphine palladium is added, and the mixture is stirred and heated to 90° C. and reacted for 5 hours. After the reaction is completed, the mixture is poured into an aqueous solution of ammonium chloride, extracted with dichloromethane, dried, and concentrated by suction. The resulting solid is eluted with dichloromethane and columned on silica gel and is recrystallized with methanol-chloroform to give 1.6 g of a red pure product with a yield of 85%.

(7) Preparation of Monomer 2,6-(bis-5-bromo-2-thienyl)-N,N-diperfluorooctyl-1,4,5,8-naphthalene-diimide 1.27 g (1 mmol) of the product obtained by the reaction (6) is added to a 250 mL two-necked flask with a stirrer, 20 mL of DMF and 60 mL of chloroform are added, and the mixture was stirred and dissolved, and then 0.392 g of NBS was dissolved in a mixed solvent of 20 mL of chloroform and 40 mL of DMF, which is slowly added dropwise to the reaction flask under an ice bath, and the reaction is carried out in the dark for two days. After the reaction is completed, the reaction solution is directly concentrated to a solid. The solid is eluted with dichloromethane, and columned on silica gel. The resulting solid is recrystallized with acetone-chloroform to give 1.37 g of red needle crystals with a yield of 96%.

Example 3

Preparation of poly{2,7-[9,9'-bis(N,N-diethylhexyl-6-amino)fluorene]-co-5,5'-[2,6-(bis-2-thienyl)-N,N'-diperfluorooctyl-1,4,5,8-naphthalenediimide]} (PN-DIFT-F6N)

The chemical reaction scheme is shown below and the specific reaction steps and reaction conditions are as follows:

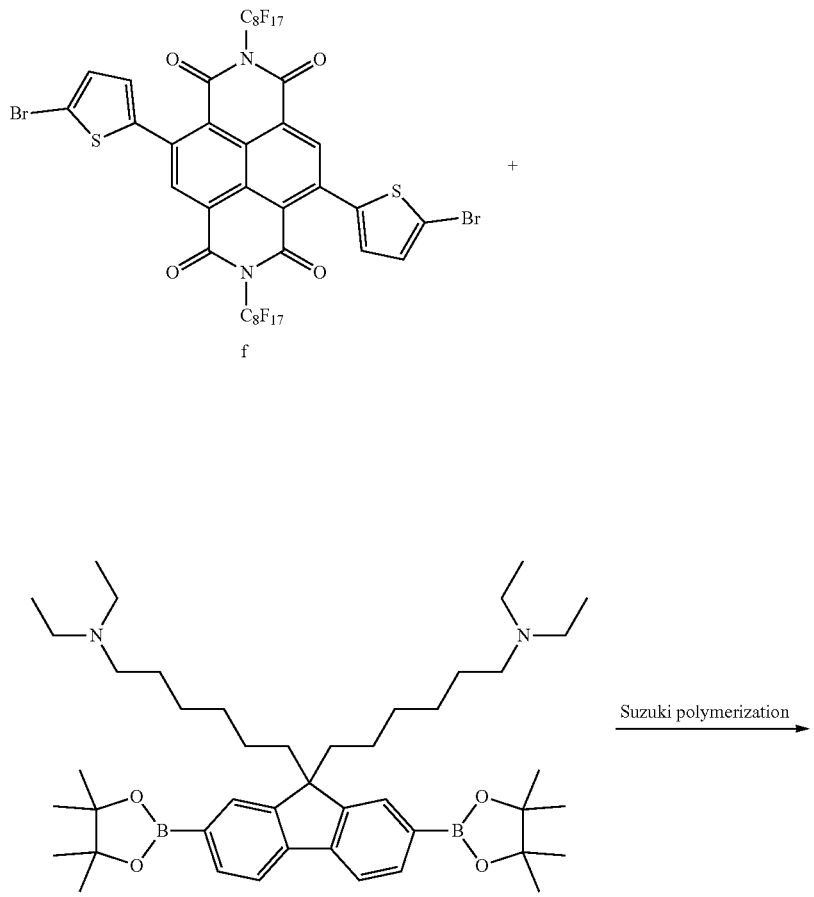

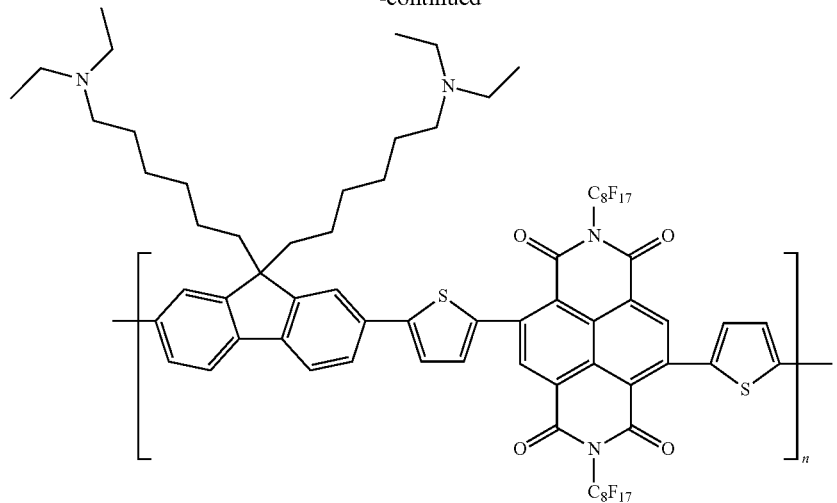

Figure 3:
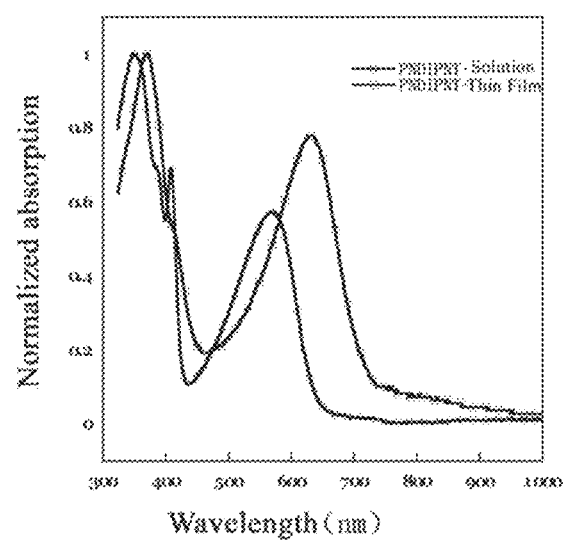
FIG. 3 shows the UV-Vis absorption spectrum of the polymer according to one example of the present invention.

0.712 g of the monomer 2,6-(bis-5-bromo-2-thienyl)-N,N'-diperfluorooctyl-1,4,5,8-naphthalenediimide and 0.364 g of the monomer 2,7-bis(trimethylene borate)-9,9'-bis(N,N-diethylhexyl-6-amino)fluorene are added to a 15 mL thick-walled pressure proof tube with a stirrer. Then, 1 mL of 20% tetrabutylammonium hydroxide solution, 2 mL of purified tetrahydrofuran and 4 mL of clean toluene, and 25 mg of catalyst tetraphenylphosphine palladium are added, nitrogen is passed for 20 minutes. the tube is sealed, and the reaction solution is stirred and heated to 110° C. for 1 hour. The reaction solution is precipitated into methanol to obtain a crude product, which is filtered and dried. The polymer is then washed with acetone in a Soxhlet extractor for 24 hours, and then counter-extracted with chloroform to give 0.76 g of the desired polymer in a yield of 86%. Mn=19000, PDI=1.7. The degree of polymerization and the dispersion coefficient of the polymer of the present invention can be characterized by gel permeation chromatography, the absorption spectrum of the polymer is measured by UV-Vis spectrometer, and the test results are shown in FIG. 3, where the solution is prepared by dissolving the polymer in a fluorobenzene solvent, and the thin film is prepared by spin-coating a 1:1 ratio by volume of fluorobenzene and chloroform.

Example 4

The polymers of Formula II, Formula III, Formula IV and Formula V are prepared in a similar manner to those described in Examples 1-3, in which the synthesis of the polymer is achieved using Sonogashira polymerization or Still polymerization.

Formula III

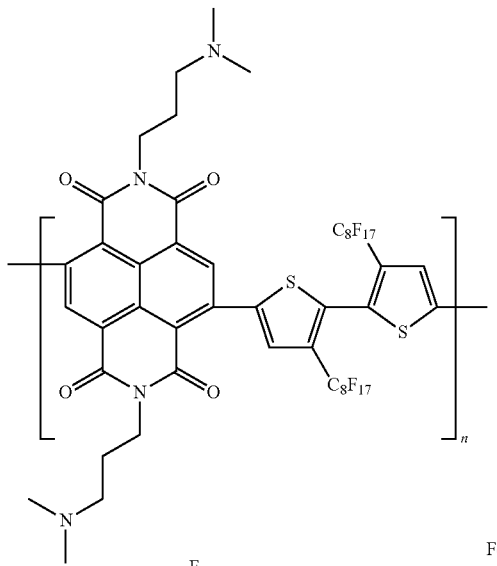

Formula IV

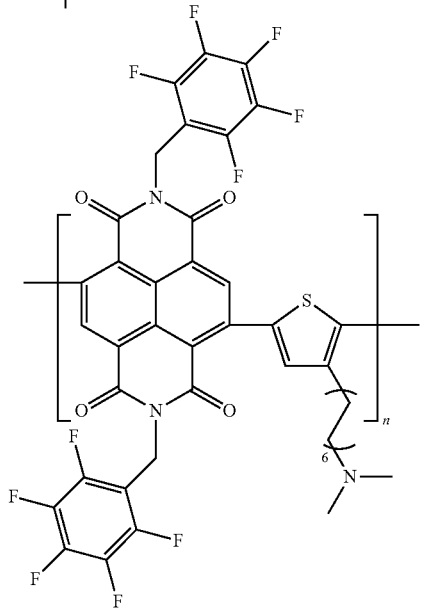

Formula V

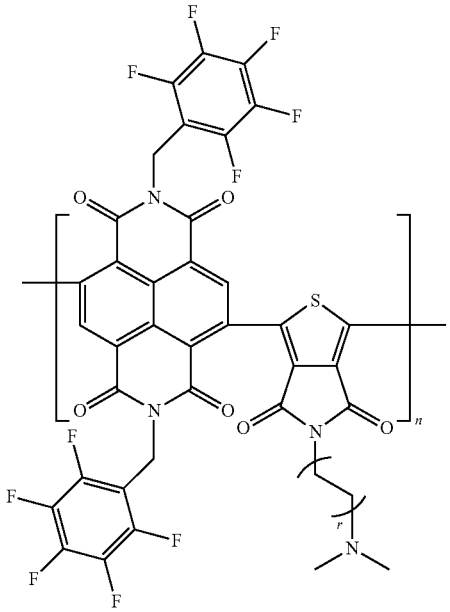

wherein n is an integer of 1 to 10000.

Example 5

Preparation of Perovskite Photoactive Layer $CH_3NH_3I$, $PbI_2$ and $PbCl_2$ in a ratio of 4:1:1 are blended and dissolved in 1 mL DMF to prepare a solution with a mass fraction of 40%. The solution is heated to 60° C. and stirred for 12 hours to obtain a photoactive layer material precursor solution, and a perovskite photoactive layer is then formed by spin coating.

Example 6

The product obtained in Example 3 is taken as an example to illustrate the use of such a polymer material as an electron-transporting layer in a solar cell device.

The ITO glass (Indium Tin Oxide Conductive Glass) is sequentially ultrasonically washed with acetone, a micron-sized semiconductor-dedicated detergent, deionized water, and isopropyl alcohol, purged with nitrogen, and placed in a constant temperature oven for later use. Before use, the ITO glass is plasma bombarded in a plasma etcher for 10 minutes. Then, a PEDOT:PSS (poly 3,4-ethylenedioxythiophene: polystyrene sulfonate) aqueous dispersion (1%) (available from Bayer) is spin-coated at high speed by a homogenizer, and the surface profiler is used to monitor the thickness. After the film is formed, the residual solvent is removed in a constant-temperature vacuum oven, and the film thickness of the vertical film, PEDOT:PSS, on the ITO substrate is about 40 nm. A perovskite solution with a mass fraction of 40% prepared in Example 5 is spin-coated on the PEDOT:PSS film layer at a rate of 3000 rpm, and is annealed at 100° C. for 1 hour to obtain a perovskite active layer. The polymer obtained in the Example 3 above is dissolved in chlorobenzene and fluorobenzene (volume ratio 2:0.5) to obtain a solution having a concentration of 80 mg/mL. The resulting solution is spin-coated onto the perovskite active layer as an electron-transporting layer at 2000 rpm. Finally, an 80 nm thick silver electrode is deposited on the electron-transporting layer by evaporation. Thus, the solar cell device of Example 6 is obtained.

Examples 7-10

The solar cells of Example 7-10 are prepared in substantially the same manner as in Example 6, except that the materials of the electron-transporting layer are prepared by using the polymers of Formula II, Formula III, Formula IV, and Formula V, respectively.

Comparative Example

A solar cell device is prepared in substantially the same manner as in Example 6, except that poly{2,7-[N,N'-bis-(2-ethylhexane)-1,7-dithiophene-naphthalenetetracarboxylic acid diimide]-co-2,7-[9,9'-bis(N,N-diethylhexyl-6-amino) fluorene]} is used as the material of the electron-transporting layer.

Test Example

The properties of the solar cell devices obtained in Examples 6 to 10 and Comparative Example are examined.

| Examples | Photoelectric conversion efficiency (FF %) | Stability |
| --- | --- | --- |
| Example 6 | 16.04% (75) | Stored in air (relative humidity: 55%) for 48 hours, cell device efficiency is reduced by 5% |
| Example 7 | 12.38% (65) | Stored in air (relative humidity: 55%) for 48 hours, cell device efficiency is reduced by 28% |
| Example 8 | 15.43% (72) | Stored in air (relative humidity: 55%) for 48 hours, cell device efficiency is reduced by 4% |
| Example 9 | 11.45% (63) | Stored in air (relative humidity: 55%) for 48 hours, cell device efficiency is reduced by 35% |
| Example 10 | 13.65% (67) | Stored in air (relative humidity: 55%) for 48 hours, cell device efficiency is reduced by 10% |
| Comparative Example | 10.35% (60) | Stored in air (relative humidity: 55%) for 48 hours, cell device efficiency is reduced by 70% |

As a result, it is found that the light energy conversion efficiency of the device using the polymer of Example 6 as an electron-transporting layer is comparable to that of the Comparative Example, but, the stability in air of the device using the polymer of Example 6 as an electron-transporting layer is much better than that of the Comparative Example. That is, when the solar cell devices of the present invention and the solar cell device of the Comparative Example work under the same conditions for the same time, the attenuation of the photoelectric conversion efficiency of the solar cell device of the present invention is much smaller than that of the comparative example.

In the description of the present specification, the reference terms "one embodiment", "some embodiments", "examples", "specific examples", or "some examples" and the like means that the specific features, structures, materials, or characteristics described in conjunction with the embodiments or examples are included in at least one embodiment or example of the present invention. In the present description, the schematic representation of the above terms does not necessarily have to refer to the same embodiment or example. Furthermore, the specific features, structures, materials, or characteristics described may be combined in any suitable manner in any one or more of the embodiments or examples. In addition, those skilled in the art may combine and associate the different embodiments or examples described in this specification and the features of different embodiments or examples without conflicting with each other.

Although the embodiments of the present invention have been shown and described above, it is to be understood that the above embodiments are exemplary and should not be construed as limiting the present invention. Those skilled in the art may make changes, modifications, substitutions, and variations to the above described embodiments within the scope of the present invention.

The invention claimed is:

1. A polymer wherein the polymer has one of the following structures:

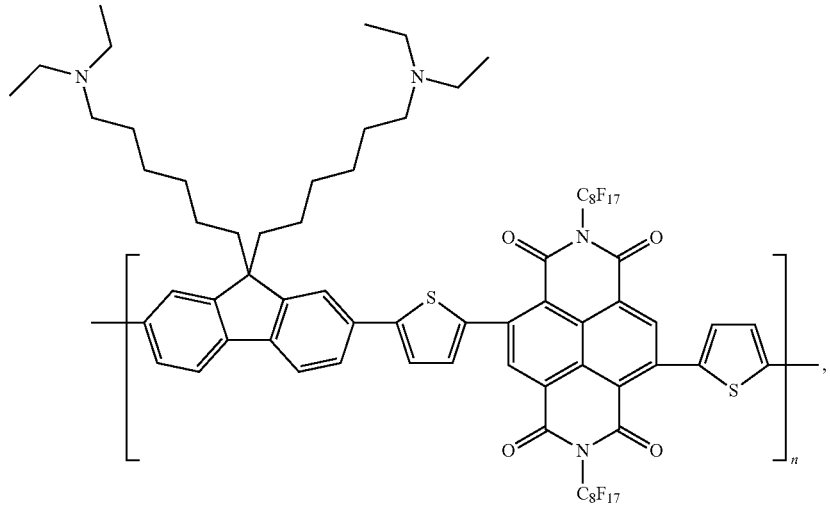

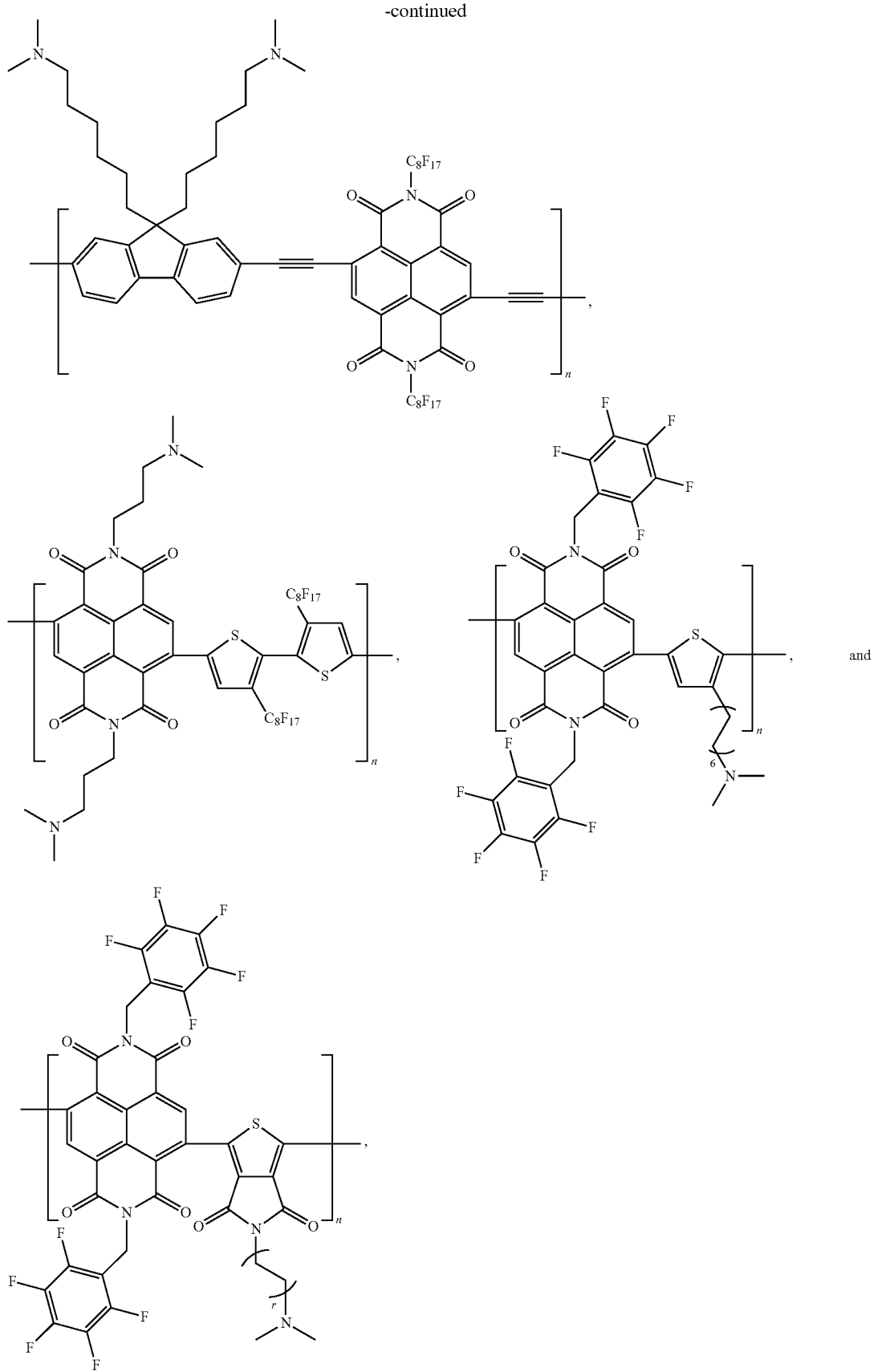
wherein n is an integer of 1 to 10000.

2. A solar cell containing a polymer,
wherein the polymer has one of the following structures:
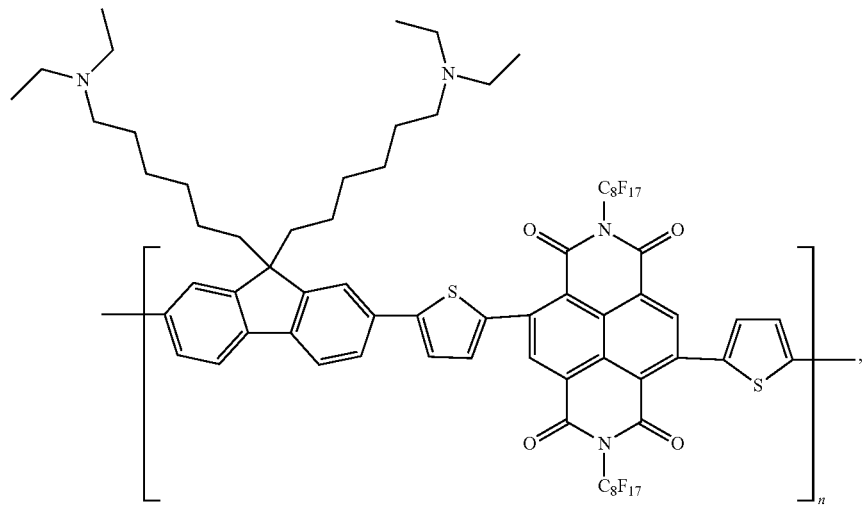
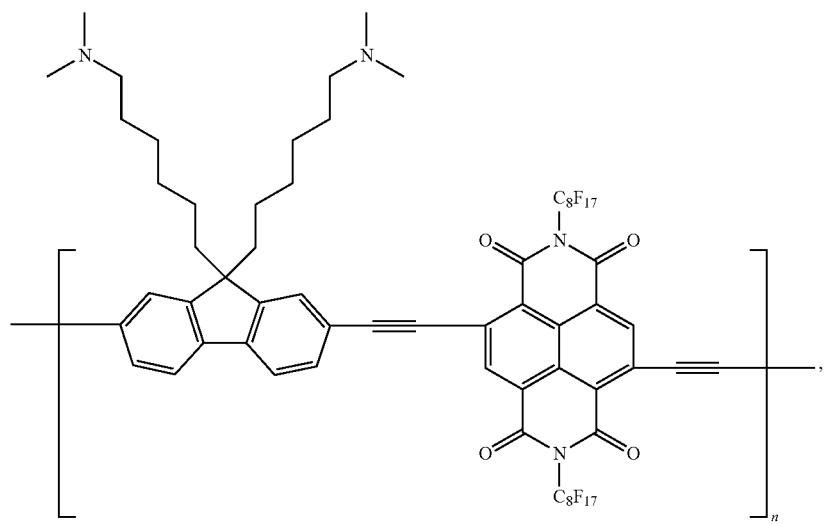
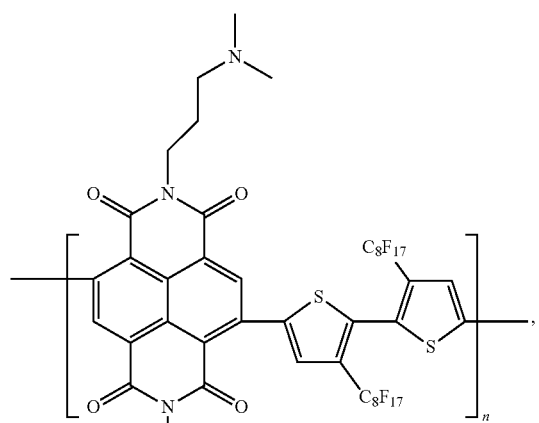
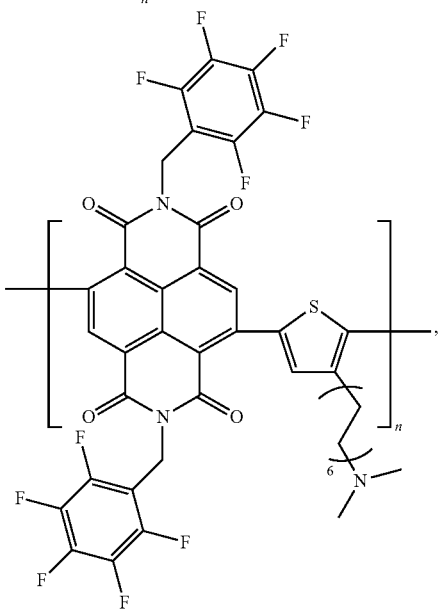
and

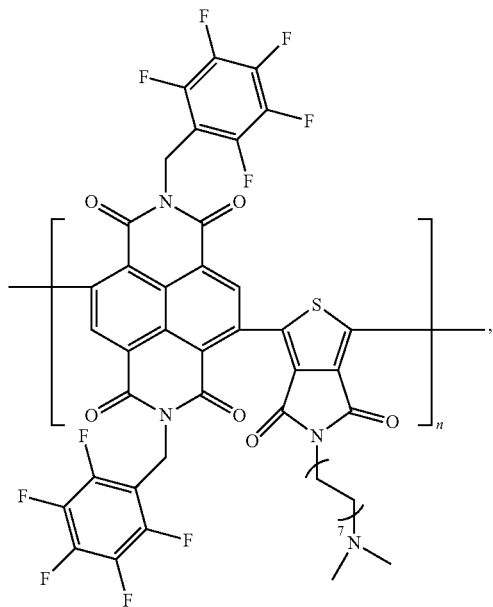

wherein n is an integer of 1 to 10000.

3. The solar cell according to claim 2, further comprising:

a cathode;

an electron-transporting layer disposed on one side of the cathode and containing the polymer;

a light-absorbing active layer disposed on the side of the electron-transporting layer away from the cathode;

a hole-transporting layer disposed on the side of the light-absorbing active layer away from the electron-transporting layer; and an anode disposed on the side of the hole-transporting layer away from the light-absorbing active layer.

4. The solar cell according to claim 3, wherein the light-absorbing active layer contains perovskite.

* * * * *